(12) United States Patent
Saito et al.

(10) Patent No.: US 7,599,076 B2
(45) Date of Patent: Oct. 6, 2009

(54) METHOD FOR OPTICALLY DETECTING HEIGHT OF A SPECIMEN AND CHARGED PARTICLE BEAM APPARATUS USING THE SAME

(75) Inventors: Keiya Saito, Hiratsuka (JP); Masahiro Watanabe, Yokohama (JP); Yasuhiro Yoshitake, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 215 days.

(21) Appl. No.: 11/591,563

(22) Filed: Nov. 2, 2006

(65) Prior Publication Data

US 2007/0109557 A1    May 17, 2007

(30) Foreign Application Priority Data

Nov. 11, 2005    (JP)    ............................. 2005-327190

(51) Int. Cl.
*G01B 11/28*    (2006.01)
(52) U.S. Cl. ...................................................... 356/630
(58) Field of Classification Search ................. 356/630, 356/600, 369, 401; 250/310, 491.1, 559.3
See application file for complete search history.

(56) References Cited

U.S. PATENT DOCUMENTS

| | | | |
|---|---|---|---|
| 5,602,400 A | | 2/1997 | Kawashima |
| 6,107,637 A | | 8/2000 | Watanabe et al. |
| 6,335,532 B1 | | 1/2002 | Tanaka et al. |
| 6,542,248 B1 | * | 4/2003 | Schwarz ...................... 356/600 |
| 6,597,006 B1 | * | 7/2003 | McCord et al. ......... 250/559.19 |
| 2002/0093656 A1 | * | 7/2002 | Takeuchi et al. ............ 356/394 |

FOREIGN PATENT DOCUMENTS

| | | |
|---|---|---|
| JP | 59-197806 | 11/1984 |
| JP | 10-4055 | 1/1998 |
| JP | 10-318718 | 12/1998 |
| JP | 11-149895 | 6/1999 |
| JP | 11-183154 | 7/1999 |
| JP | 2001-077004 | 3/2001 |
| JP | 2003-177101 | 6/2003 |

* cited by examiner

*Primary Examiner*—Tarifur R. Chowdhury
*Assistant Examiner*—Isiaka O Akanbi
(74) *Attorney, Agent, or Firm*—Antonelli, Terry, Stout & Kraus, LLP.

(57) ABSTRACT

The present invention provides an optical height detection method and electron beam apparatus to which the method is applied, in which the focusing accuracy of the CD-SEM apparatus, a SEM inspection apparatus, and others is improved by reducing detection errors and improving detection accuracy so as to improve the accuracy of the optical height detection method, and throughput of a CD-SEM apparatus or others is improved by reducing the processing time of automatic focus control performed based on the detected height according to the optical height detection method. An optical detection optical system projects two-dimensional slit light to a measurement object from diagonally above it, detects the light reflected by the measurement object, converts a detected two-dimensional slit image into an electrical signal by a two-dimensional area sensor, eliminates slit parts having a large detection error from the electrical signal, and detects the height of the measurement object.

9 Claims, 15 Drawing Sheets

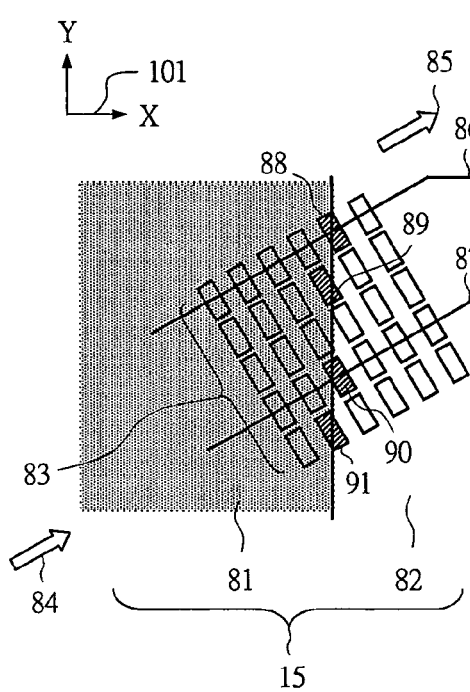
FIG. 4A
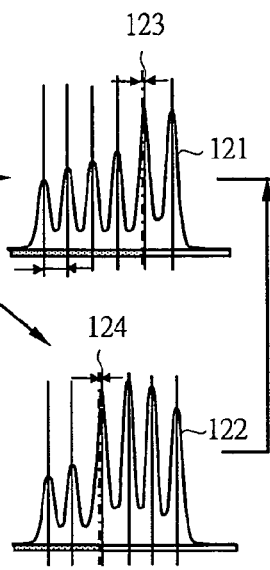
FIG. 4C
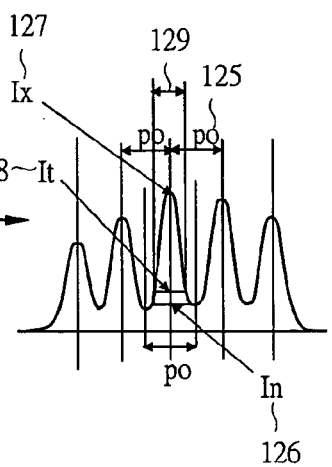
FIG. 4D
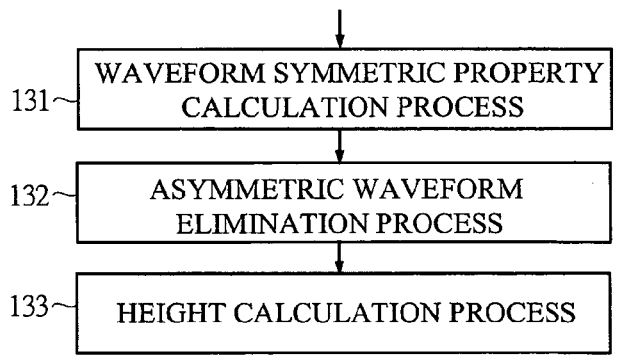
FIG. 4E
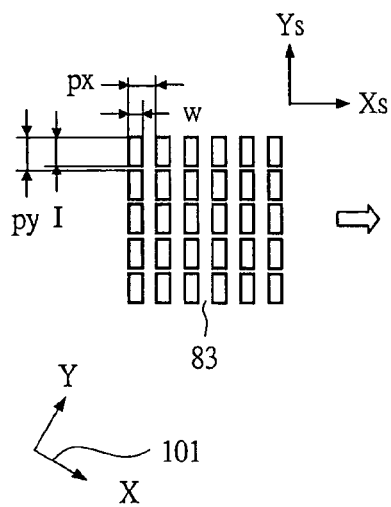
FIG. 4B
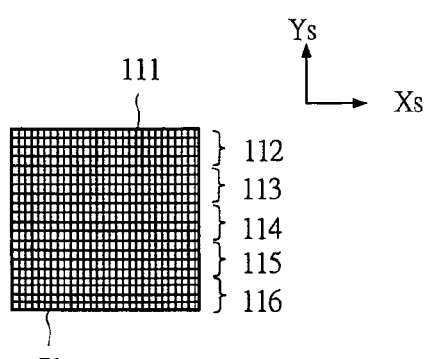
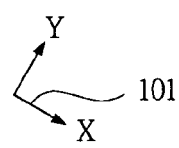

Pc: PERMISSIBLE ERROR

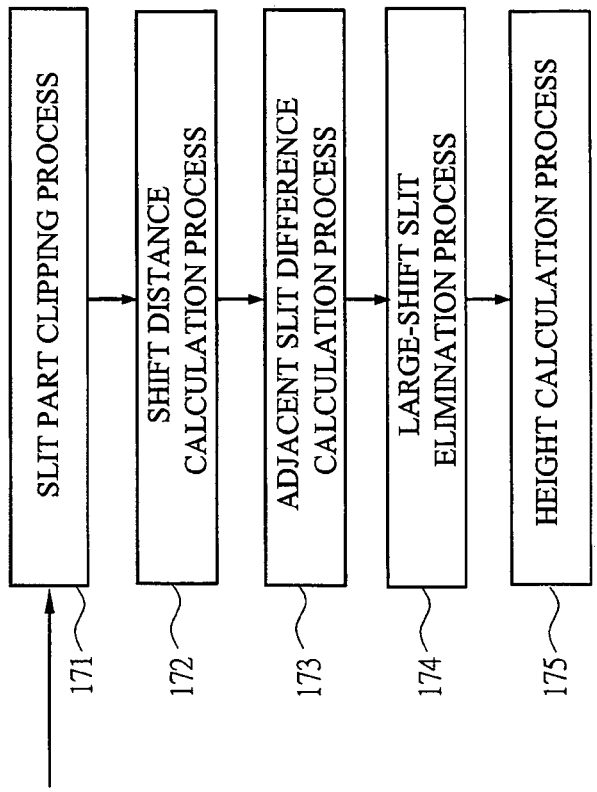
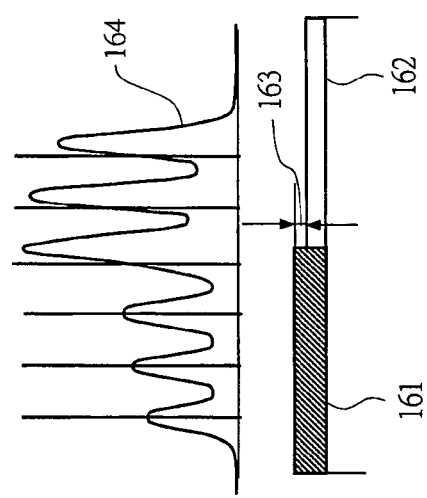
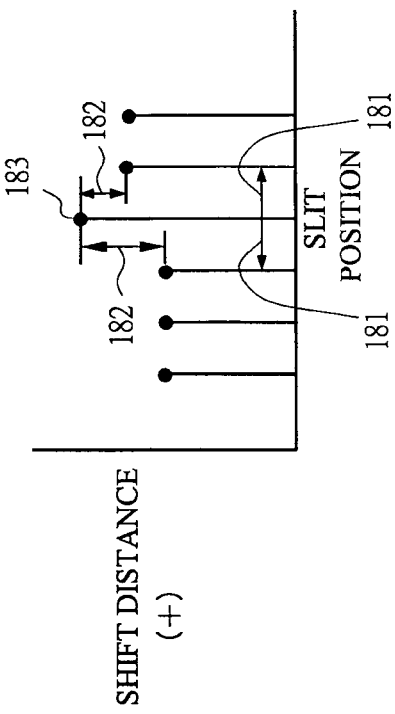

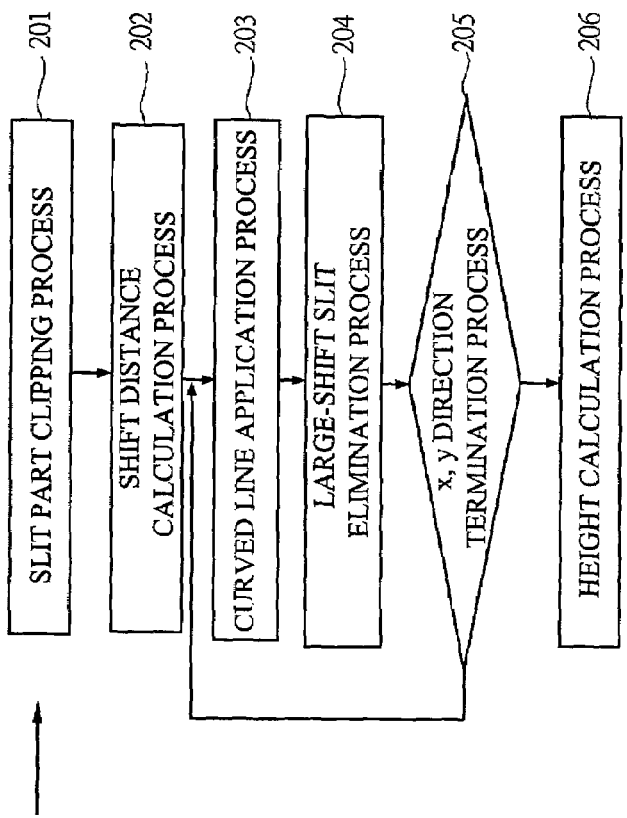
FIG. 8A
FIG. 8B
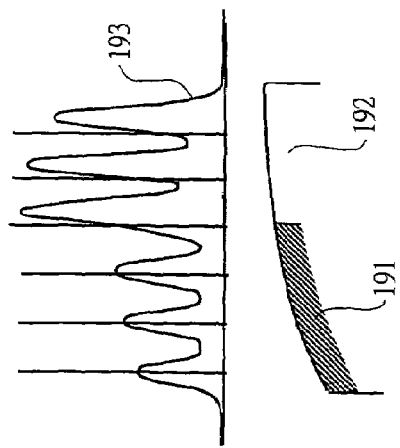
FIG. 8C
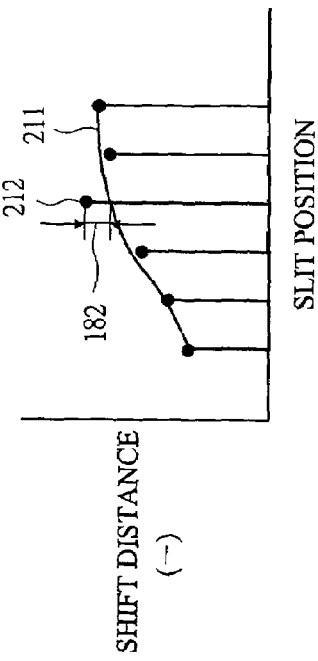

FIG. 14A
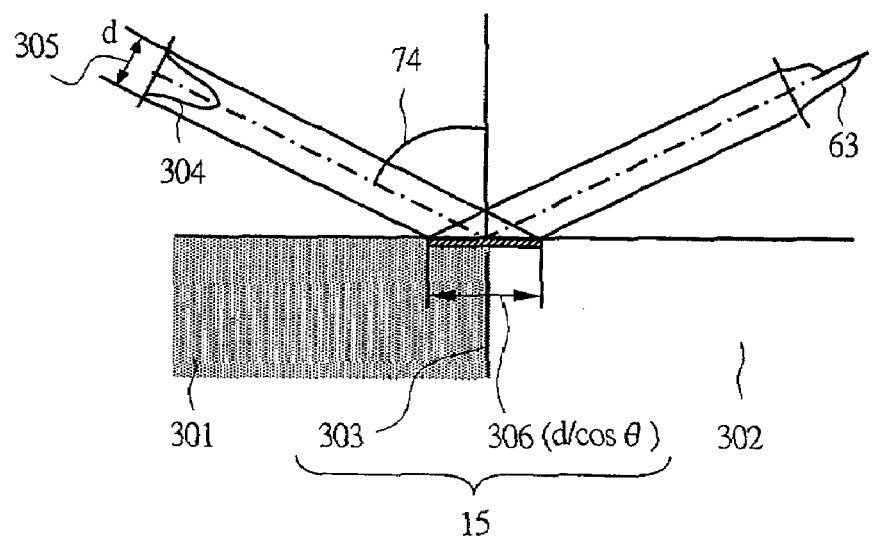
FIG. 14B
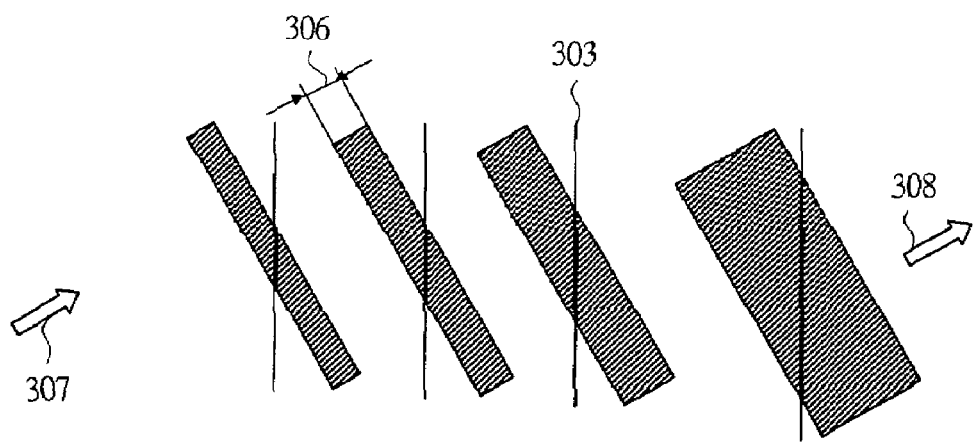
| INCIDENT ANGLE θ | 50° | 60° | 70° | 80° |
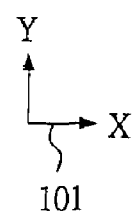

METHOD FOR OPTICALLY DETECTING HEIGHT OF A SPECIMEN AND CHARGED PARTICLE BEAM APPARATUS USING THE SAME

CROSS-REFERENCE TO RELATED APPLICATION

The present application claims priority from Japanese Patent Application No. JP 2005-327190 filed on Nov. 11, 2005, the content of which is hereby incorporated by reference into this application.

TECHNICAL FIELD OF THE INVENTION

The present invention relates to a technology for measuring and inspecting an object by a charged particle beam image of the object obtained by irradiating charged particle beam such as an electron beam or ion beam to the object wherein a semiconductor substrate such as a semiconductor wafer serves as a target. In particular, it is suitable for an optical height detection method which optically detects the height of the wafer for focus control of a charged particle beam image and for an electron beam apparatus using the same.

BACKGROUND OF THE INVENTION

For example, as the patterns formed on semiconductor wafers are miniaturized, dimension measurement and defect detection by optical measurement and inspections conventionally performed for process control of the semiconductors have become more and more difficult. Therefore, as apparatuses using charged particle beams, measurement and inspection apparatuses using scanning electron microscopes (hereinafter, abbreviated as SEM) have been put into practical use. These are CD-SEM (Critical Dimension-SEM) apparatuses which measure the line widths of fine patterns and hole diameters for condition setting or monitoring of manufacturing processes of semiconductors and SEM inspection apparatuses which detect the defects by pattern comparison of electron beam images.

In such CD-SEM apparatuses or SEM inspection apparatuses, if the focal position of an optical system of the SEM thereof is defocused, pattern widths and hole diameters are varied and correct measurement cannot be performed, or in defect detection by pattern comparison, normal parts may be erroneously detected as defects. Therefore, focusing is important. The focusing is achieved by using an electron beam image through the adjustment of an excitation current of an objective lens. Meanwhile, in automatic focus control which automatically performs the focusing, the focal position of an objective lens is changed, an electron beam image is detected at each position, and a focused focal point is detected from the electron beam images. On the other hand, as an optical method of the focusing, there is a method in which a wafer is irradiated with slit light from a position obliquely above it, the reflected light thereof is detected, the height of the wafer is obtained from the detected position of the reflected light, and then the focusing of an objective lens is performed according to the obtained height. When magnification of a SEM is low, the focusing of an objective lens can be achieved by the optically obtained height of a wafer. However, since the focal depth of the SEM is reduced when the magnification of the SEM is high, the focusing of the objective lens according to the optically obtained height of the wafer is difficult in terms of accuracy. Therefore, automatic focus control is performed.

In general, since a plurality of electron beam images are obtained in the automatic focus control, the processing time thereof is longer than the method which optically detects the wafer height. Therefore, if the optical wafer height detection can be made more accurate, the processing time of the automatic focus control performed based on it can be shortened. In the case of a CD-SEM apparatus, since optical height detection and automatic focus control based on it are performed, the focus control takes up long time in a measurement process. Accordingly, the throughput of the CD-SEM can be improved by shortening the time of the focus control. Furthermore, in a SEM inspection apparatus, focal position control is performed by optical height detection, electron beam images are successively obtained, and a comparison test between dies or cells of the wafer is performed. Therefore, since the optical height detection can be performed at high accuracy, high-quality electron beam images of focused focal positions are obtained, and highly reliable inspection can be performed.

As optical height detection methods, Japanese Patent Application Laid-Open Publication No. 11-183154 and Japanese Patent Application Laid-Open Publication No. 11-149895 disclose the methods for an electron-beam-type measurement apparatus or an electron-beam-type inspection apparatus, in which a multi-slit-like flux of light is projected to a wafer from a point obliquely above it, the multi-slit-like flux of light reflected from the surface of the wafer is caused to form an image, image formation states having fewer detection errors are searched and subjected to a weighting process, the height of the wafer is obtained from a movement distance with respect to a reference height, and a focal point of an objective lens of an electron optical system is focused according to the obtained height.

Japanese Patent Application Laid-Open Publication No. 2002-203785 discloses the method for an exposure apparatus, in which a plurality of minute light fluxes are caused to enter a wafer surface from a light irradiation means disposed at a position obliquely above it, a plurality of reflected light fluxes from a pattern region are detected, the plane position information of the fine pattern region is detected from obtained signals to obtain the height of the wafer, and the fine pattern region is adjusted to a focal position of the exposure apparatus.

SUMMARY OF THE INVENTION

The inventors of the present invention have studied the above-described measurement and inspection technologies for objects, and as a result, the following facts have been found out. A single-slit method of FIGS. 15A and 15B and a multi-slit method of FIGS. 16A and 16B will be described with reference to the schematic drawings thereof.

For example, in a method which is performed for focus control of a CD-SEM apparatus, a SEM inspection apparatus, and others, as shown in FIG. 15A, slit light 502 generated by a single slit 501 is projected to a wafer 503 from a position obliquely above it, reflected light 504 from the wafer 503 is detected, and according to the image formation position thereof, the height of the wafer 503 is optically detected. In the optical height detection method, when a detection point is at a pattern boundary between a low-reflectance part 505 and a high-reflectance part 506 on the wafer 503, the intensity distribution of the reflected light 504 is distorted due to a difference in the reflectance between the patterns, and a difference is caused between a detection position obtained from the intensity distribution 507 of the detected light and a real detection position. Consequently, a detection error 508 occurs, and it has been unable to perform highly accurate height detection. Therefore, a method as shown in FIG. 16A has been performed, in which slit light 502 generated by a multi-slit 511 is projected, and the slit width is reduced so as to reduce the detection error 408.

In the above-described Japanese Patent Application Laid-Open Publication No. 11-183154 and Japanese Patent Application Laid-Open Publication No. 11-149895, multi-slit light is projected, the multi-slit light reflected on a wafer is detected, a detection state having small detection error is searched from a detected slit image, and a weighting process is performed, thereby performing height detection. Though the detection error is reduced by the multi-slit and the weighting process, they are not completely removed. In the above-described Japanese Patent Application Laid-Open Publication No. 11-149895, two-dimensional spot light is projected, and the reflected light from a wafer is detected, thereby performing height detection at the two-dimensional spot position on the wafer. At this time, when each spot is formed from multi minute spots and the detection point of each spot is at a pattern boundary on the wafer, detection errors are reduced by averaging the detection positions of the multi minute spots and using them as the detection position of each spot. However, the errors are not completely eliminated.

In view of the foregoing, the present invention relates to an optical height detection method and an electron beam apparatus to which the method is applied, in which the focusing accuracy of the CD-SEM apparatus, a SEM inspection apparatus, and others is improved by reducing detection errors and improving detection accuracy so as to improve the accuracy of the optical height detection method, and throughput of a CD-SEM apparatus or others is improved by reducing the processing time of automatic focus control which is performed based on the detected height according to the optical height detection method.

The above and other objects and novel characteristics of the present invention will be apparent from the description of this specification and the accompanying drawings.

The typical ones of the inventions disclosed in this application will be briefly described as follows.

The present invention provides an optical height detection method, an apparatus of the same, and an electron beam apparatus (CD-SEM apparatus, SEM inspection apparatus) using the same, and it has the following characteristics.

An optical height detection method according to the present invention comprises the steps of: projecting two-dimensional slit light to an object from a position diagonally above the object; detecting light of the projected two-dimensional slit light reflected by said object; converting a two-dimensional slit image of the detected two-dimensional slit light into an electrical signal by a two-dimensional area sensor; and eliminating slit parts, in which a detection error is large, from the electrical signal of the converted two-dimensional slit image and detecting the height of said object.

Moreover, the optical height detection apparatus of the present invention comprises: a projection optical system which projects two-dimensional slit light to the object from a position diagonally above the object; a detection optical system which detects light of the two-dimensional slit light reflected from the object; a two-dimensional area sensor which converts a two-dimensional slit image of the detected two-dimensional slit light into an electrical signal; and height detection means which detects the height of the object by performing a process of eliminating a slit part including large detection error from the electrical signal of the converted two-dimensional slit image.

Moreover, the electron beam measurement apparatus (CD-SEM apparatus) of the present invention comprises: a scanning electron microscope system including an electron beam source, a condenser lens which converges an electron beam emitted from the electron beam source, a deflector which deflects the electron beam converged by the condenser lens, an objective lens which converges the electron beam deflected by the deflector onto a measurement object and irradiates the object with the beam, a secondary electron detector which detects secondary electrons generated from the measurement object irradiated with the electron beam, and image processing means which measures a pattern formed on the measurement object based on a secondary electron beam image detected by the secondary electron detector; a focus control system including focus control means which performs focus control by controlling an excitation current of the objective lens and automatic focus control means which performs automatic focus control of the objective lens according to the secondary electron beam image; and the above-described optical height detection apparatuses (projection optical system, detection optical system, two-dimensional area sensor, and height detection means).

Also, the electron beam detection apparatus (SEM inspection apparatus) according to the present invention comprises: an electron beam source, a condenser lens, a deflector, an objective lens, a secondary electron detector included in the above-described scanning electron microscope system; a scanning electron microscope system including image processing means which inspects a pattern formed on the measurement object based on a secondary electron beam image detected by the secondary electron detector and an XY stage which moves the measurement object at a constant speed; focus control means which performs focus control by controlling an excitation current of the objective lens; and the above-described optical height detection apparatuses (projection optical system, detection optical system, two-dimensional area sensor, and height detection means).

Furthermore, the optical height detection method, the apparatus of the same, and the electron beam apparatuses (CD-SEM apparatus, SEM inspection apparatus) using the same according to the present invention perform, as a process for eliminating the slit part including the large detection error from the electrical signal of the converted two-dimensional slit image, the steps: (1) symmetric property of the detected waveform is calculated for each slit (waveform symmetric property calculation means), a slit part having an asymmetrical waveform is eliminated, and a height detection process of the object is performed by using only a slit part having a symmetric waveform; (2) a shift distance of the slit image is calculated for each slit (shift distance calculation means), a difference between the calculated shift distance and a shift distance of an adjacent slit is calculated (adjacent slit shift distance calculation means), a slit part in which the difference between the calculated shift distance and the adjacent shift distance is larger than a predetermined value is eliminated, and a height detection process of the object is performed by using only the shift distance of a slit part in which the difference is smaller than the predetermined value; and (3) a shift distance of the slit image is calculated for each slit (shift distance calculation means), the calculated shift distance is applied to a curved line for each detection line respectively in an x direction and a y direction (curved line application means), a slit part in which the difference between the shift distance and the applied curved line is large is eliminated, and a height detection process of the object is performed by using only a slit part in which the difference is small.

The effects obtained by typical aspects of the present invention will be briefly described below.

According to the present invention, when the height of an object is to be optically detected, two-dimensional slit light is projected to the object from a position diagonally above it, a slit part having a large detection error is eliminated from the electrical signal of the two-dimensional slit image obtained by the reflected light detected by the two-dimensional area sensor, and the height of the object is detected from the shift distance of the slit part other than eliminated ones. Thus, the detection error can be significantly reduced, and highly accurate height detection can be performed. In addition, in an electron beam apparatus which performs focus control through optical height detection, for example, in the case of a CD-SEM apparatus, optical height detection and automatic focus control based on that are performed, and if highly accurate optical height detection can be performed, the processing time of the automatic focus control can be reduced. Therefore, the throughput of the CD-SEM apparatus can be improved. In addition, in the case of a SEM inspection apparatus, focus position control is performed through optical height detection, electron beam images are successively obtained, and comparison test of patterns is performed. Therefore, when the accuracy of the optical height detection is increased, high-quality electron beam images of focused positions can be obtained, and highly reliable inspection can be performed.

These and other objects, features and advantages of the invention will be apparent from the following more particular description of preferred embodiments of the invention, as illustrated in the accompanying drawings.

BRIEF DESCRIPTIONS OF THE DRAWINGS

FIG. 4A is a plan view of a measurement object showing a state where a slit image is projected to a low-reflectance part and a light-reflectance part of the measurement object;

FIG. 4B is a plan view showing an enlarged two-dimensional area sensor;

FIG. 4C shows signal waveforms in the case where the signals detected by the two-dimensional area sensor are detected as a plurality of one-dimensional slit images;

FIG. 4D is an enlarged diagram of a one-dimensional slit detected waveform;

FIG. 4E is a flow chart showing a flow for processing a detected waveform signal;

FIG. 7A shows, in the lower part thereof, a plan view of a measurement object illustrating the state of a low-reflectance part and a high-reflectance part, and in the upper part thereof, a diagram of a waveform signal obtained by projecting a slit image to the measurement object and detecting it;

FIG. 7B is a process flow chart for obtaining the height of a measurement object by processing the slit image detected waveform signal;

FIG. 7C is a graph showing height shift distances at respective positions of the slit image calculated by the shift distance calculation process of FIG. 7B;

FIG. 8A shows, in the lower part thereof, a plan view of a measurement object which has a low-reflectance part and a high-reflectance part and is inclined as a whole, and in the upper part thereof, a diagram of a waveform signal obtained by projecting a slit image to the measurement object and detecting it;

FIG. 8B is a process flow chart for obtaining the height of the measurement object by processing the slit image detected waveform signal;

FIG. 8C is a graph showing the height shift distances at respective positions of the slit image calculated in the shift distance calculation process of FIG. 8B;

FIG. 14A is a cross sectional view of the measurement object showing the state where two-dimensional slit light enters a measurement object and is reflected;

FIG. 14B is a diagram showing the relation between the incident angle of the two-dimensional slit light into the measurement object and projected images of the two-dimensional slit light on the measurement object;

Figure 16A:
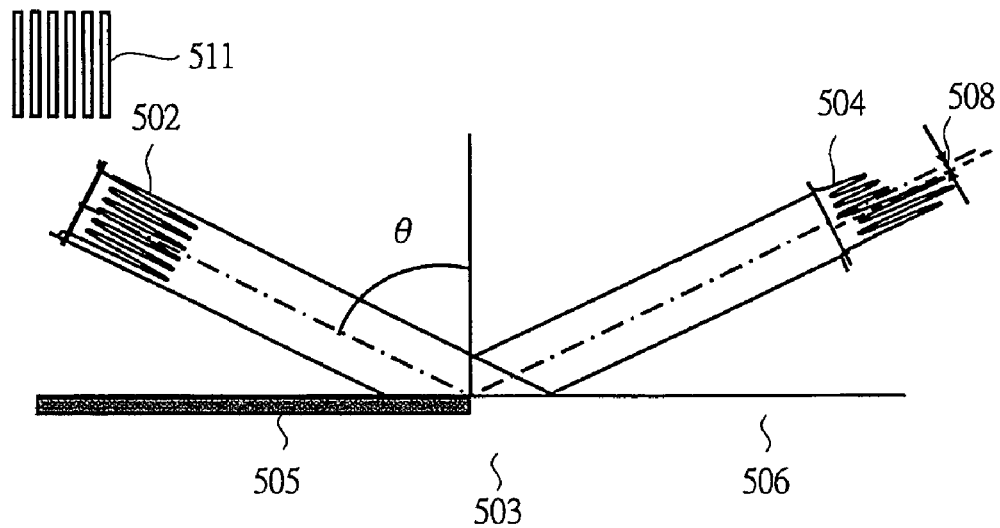
Figure 16B:
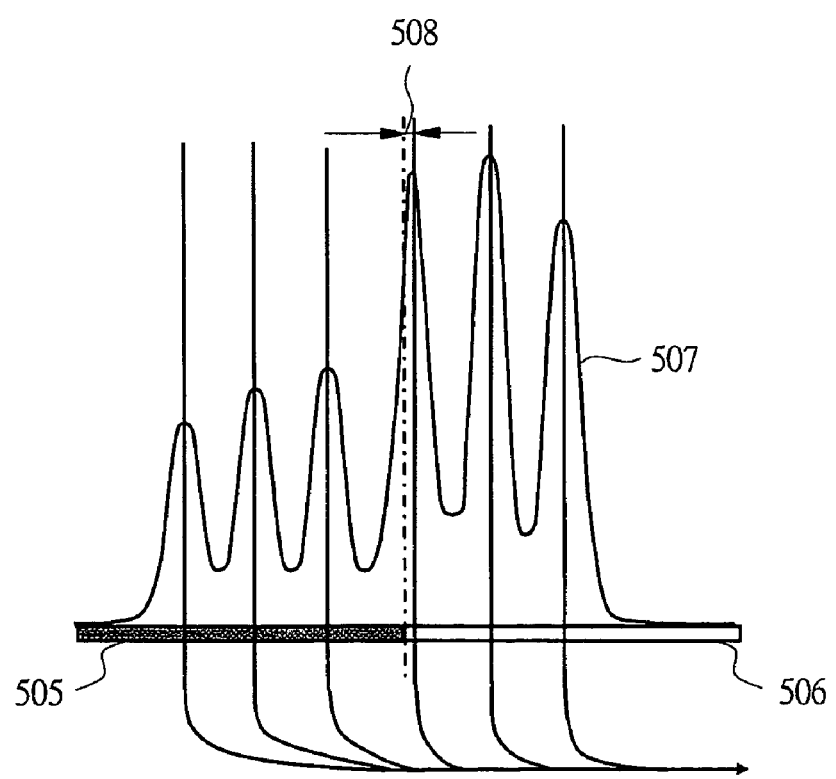

FIG. 16A is a diagram for explaining a multi-slit method of a conventional technology and is a cross sectional view of a measurement object showing the state where multi-slit light enters the measurement object and is reflected; and FIG. 16B is a diagram for explaining the multi-slit method of the conventional technology and is a diagram of a detected waveform signal which is obtained by detecting the reflected light image of the multi-slit light.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
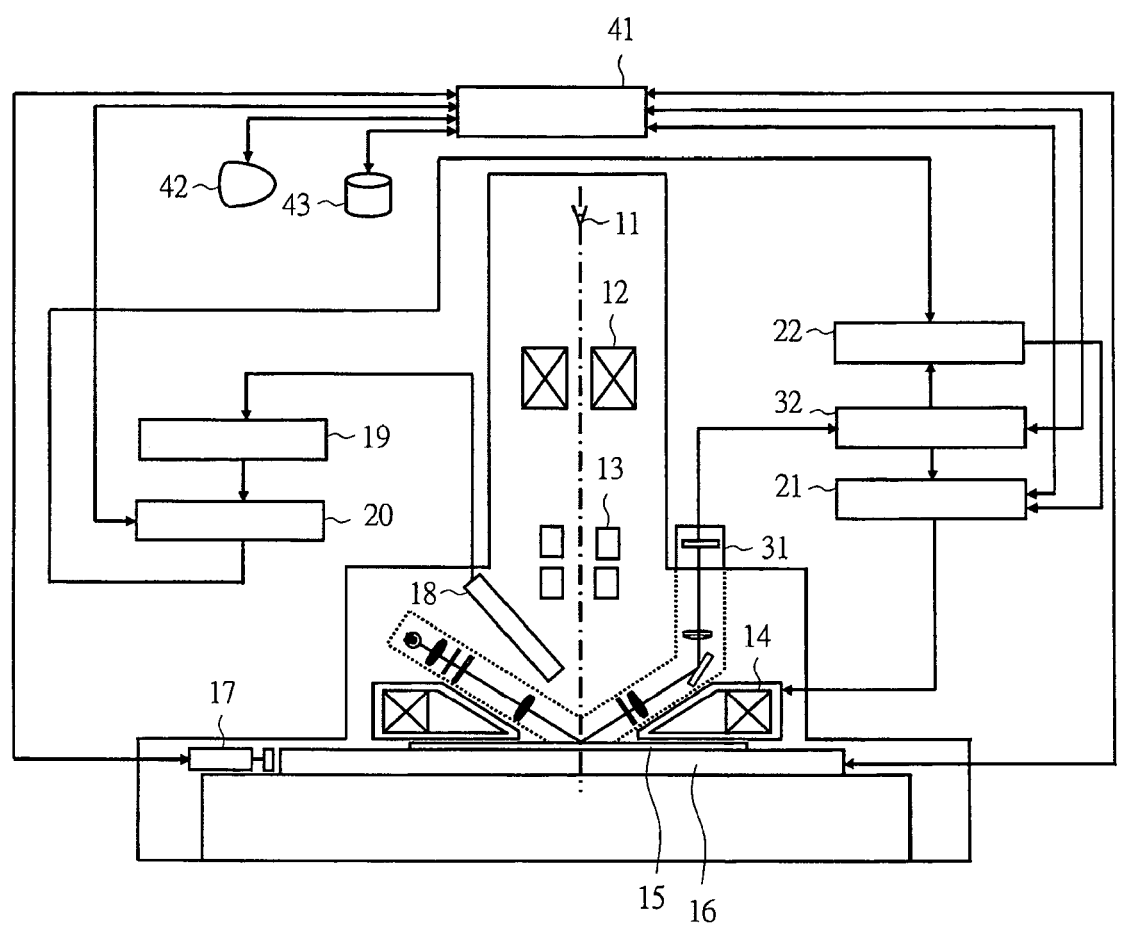
FIG. 1 is a schematic diagram showing a configuration of a CD-SEM apparatus in a first embodiment of the present invention.

FIG. 1 is a schematic diagram showing a configuration of a CD-SEM apparatus in a first embodiment of the present invention. The CD-SEM apparatus obtains electron beam images of a measurement object (measured object, object to be measure) 15 by a scanning electron microscope and measures line widths of fine patterns and hole diameters of the measurement object 15 by image processing for condition setting or monitoring of semiconductor manufacturing processes.

The CD-SEM apparatus comprises: a scanning electron microscope system which obtains electron beam images of the measurement object 15 and performs image processing; a focus control system which performs focusing of the scanning electron microscope; an optical height detection system which detects the height of the measurement object 15; and an overall control system.

The scanning electron microscope system includes: an electron beam source 11 which emits an electron beam; a condenser lens 12 which converges the electron beam emitted from the electron beam source 11; a deflector 13 which performs two-dimensional scanning of the converged electron beam; an objective lens 14 which converges the electron beam onto the measurement object 15; an XY stage 16 on which the measurement object 15 is placed; a laser measurement device 17 which measures the position of the measurement object 15; a secondary electron detector 18 which detects secondary electrons emitted from the measurement object 15 through irradiation of the electron beam; an A/D converter 19 which performs A/D conversion of the detected secondary electron signals; and image processing means 20 which performs image processing of an electron beam image (SEM image) of the A/D converted secondary electron signals and measures the widths or hole diameters in a pattern in a specified image.

The focus control system includes: a focus controlling device (focus controlling means) 21 which performs focusing of the objective lens 14 by adjusting an excitation current of the objective lens 14 of the scanning electron microscope; and an automatic focus controlling device (automatic focus controlling means) 22 which varies the focal position of the objective lens 14 by the focus controlling device 21, detects an electron beam image at each varied point, and detects a focused focal point from the electron beam images.

The optical height detection system includes: an optical height detection optical system 31 which has a projection optical system, a detection optical system, a two dimensional area sensor, height detection means, and others and which projects two-dimensional slit light to the measurement object 15, detects the two-dimensional slit light reflected by the measurement object 15, and detects an electrical signal of a two-dimensional slit image thereof by a two-dimensional area sensor; and a height calculation processing device 32 which eliminates the slit part having a large detection error from the electrical signal of the two-dimensional slit image and calculates the height of the object.

The overall control system includes: an overall control unit 41 which performs the overall control of the scanning electron microscope system, the focus control system, and the optical height detection system, and displays a processing result by the image processing means 20 on display means 42 or stores it together with the coordinate position of the measurement object 15 in storage means 43.

Next, the optical height detection optical system 31 and the height calculation processing device 32 in the optical height detection system will be described with reference to FIGS. 2A and 2B, FIG. 3, and FIGS. 4A to 4E.

Figure 2A:
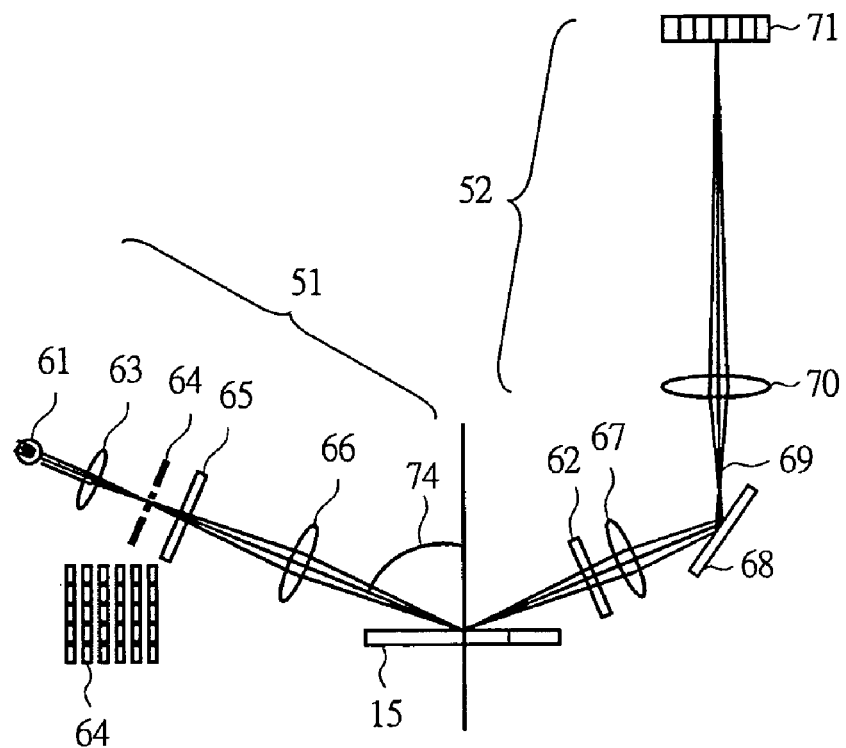
FIG. 2A is a schematic front view showing a configuration of an optical height detection optical system in the CD-SEM apparatus in the first embodiment.
Figure 2B:
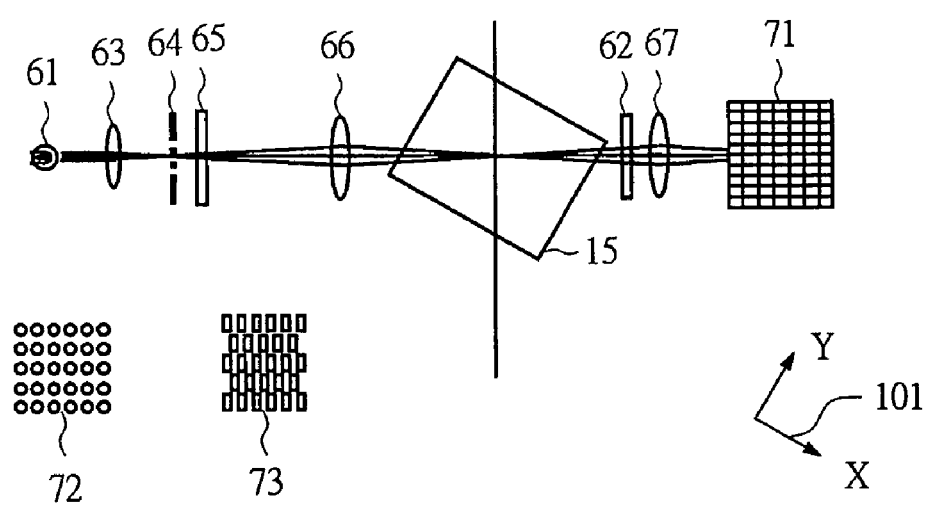
FIG. 2B is a schematic plan view showing the configuration of the optical height detection optical system in the CD-SEM apparatus in the first embodiment of the present invention.

As shown in FIGS. 2A and 2B, the optical height detection optical system 31 comprises: the projection optical system 51; and the detection optical system 52. FIG. 2B is a drawing showing the optical height detection optical system 31 in FIG. 2A viewed from above.

The projection optical system 51 includes: a white light source 61 such as a halogen lamp; a condenser lens 63 which condenses white light; a two-dimensional slit 64 which forms two-dimensional slit light; a polarization filter 65 which is set so that S-polarized light of the two-dimensional slit light transmits therethrough; and a projection lens 66 which condenses the two-dimensional slit light and forms a two-dimensional slit image in the vicinity above the measurement object 15.

The detection optical system 52 includes: a band-pass filter 62 through which a certain wavelength range of white light transmits; a detection lens 67 which condenses the two-dimensional slit light specularly reflected on the measurement object 15 and forms an intermediate two-dimensional slit image 69; a mirror 68 which changes the traveling direction of the two-dimensional slit light; a magnifying lens 70 which magnifies the intermediate two-dimensional image 69 formed by the detection lens 67 and forms an image on a two-dimensional area sensor 71; and the two-dimensional area sensor 71.

Herein, as shown in FIG. 2B, the projection optical system 51 and the detection optical system 52 are installed in a manner that they are inclined with respect to an X direction 101 of the XY stage 16 on which the measurement object 15 is placed in order to reduce detection errors in optical height detection.

The white light from the white light source 61 is irradiated to the two-dimensional slit 64 through the condenser lens 63. A short-wavelength laser light source, light-emitting diode, or the like can be used as the light source other than the white light source 61. However, in the case of monochromatic light, interference of multi-reflected light in a transparent film is caused in some cases, which leads to the shift of the slit light, the difference in reflectance between the patterns is enlarged due to variation of transparent film thickness, the intensity distribution of the reflected light is distorted, and detection errors are increased. Although the two-dimensional slit 64 herein is a rectangular repetitive pattern, a two-dimensional slit 72 which is a repetitive pattern of circles or a two-dimensional slit 73 in which the position of the pattern is shifted in each row may be used. When the surface of the measurement object 15 is coated with a transparent film such as an insulating film, which will be described later, the two-dimensional slit light is multi-reflected in the transparent film and the position of the slit light is shifted. In such a case, since S-polarized light is reflected more than P-polarized light by the surface of the transparent film, the S-polarized light is transmitted through the polarization filter 65, thereby reducing the shift distance due to the multi-reflection.

The two-dimensional slit light is condensed by the projection lens 66, and a two-dimensional slit image is formed in the vicinity of the surface of the measurement object 15. The two-dimensional slit light whose image is formed in the vicinity of the surface of the measurement object 15 is specularly reflected, and the intermediate two-dimensional slit image 69 is formed by the detection lens 67. The band-pass filter 62 narrows the wavelength range of the white light source 61 to reduce the chromatic aberration by the detection lens 67 and the magnifying lens 70, thereby reducing the wavelength dependence of the shift distance of the position of the two-dimensional slit image formed on the two-dimensional area sensor 71. The mirror 68 changes the traveling direction of the two-dimensional slit light. The intermediate two-dimensional slit image 69 is magnified by the magnifying lens 70, and an image thereof is formed on the two-dimensional area sensor 71.

Figure 3:
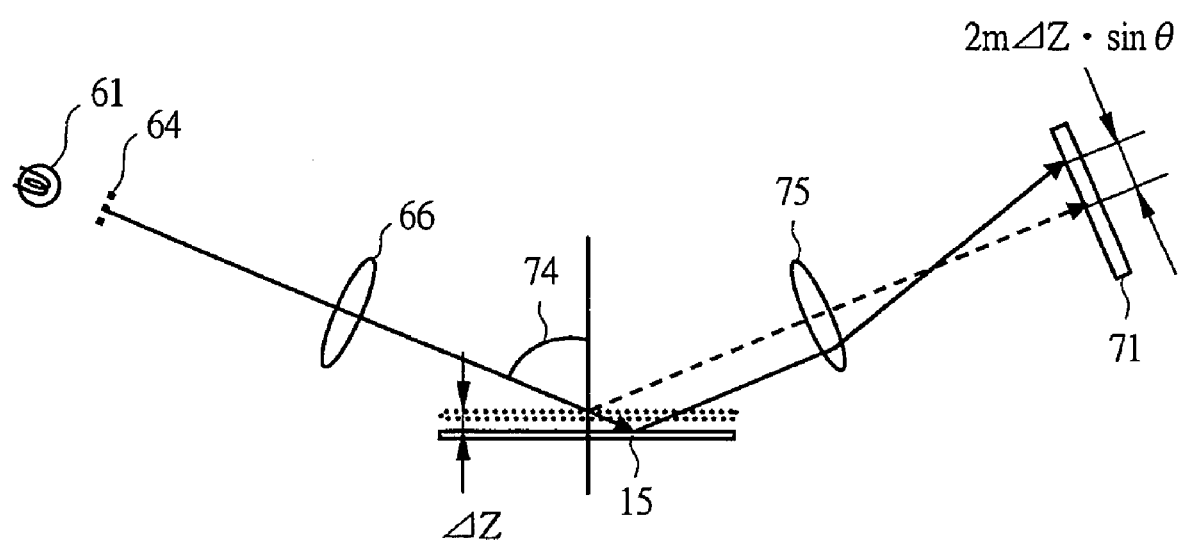
FIG. 3 is a schematic drawing for explaining the relation between the height of an object and a shift distance of a slit image in the optical height detection optical system in the CD-SEM apparatus in the first embodiment.

Herein, in FIG. 3, if the incident angle 74 of the two-dimensional slit light is defined as θ and the magnification of a detection magnifying lens 75 which is a combination of the detection lens 67 and the magnifying lens 70 of the detection optical system is defined as m, when the height of the measurement object 15 is changed by Δz as shown in FIG. 3, the two-dimensional slit image on the two-dimensional area sensor 71 is shifted by 2mΔz·sin θ overall. By utilizing this, the height calculation processing device 32 calculates the shift distance of the two-dimensional slit image according to the electrical signal of the two-dimensional slit image obtained by the two-dimensional area sensor 71 and further calculates the height Δz of the measurement object 15 according to the shift distance.

Next, a processing method in the height calculation processing device 32 will be described with reference to FIGS. 4A to 4E. FIG. 4A shows a two-dimensional slit image 83 which is formed when the slit light formed through the two-dimensional slit 64 of the projection optical system is projected onto the measurement object 15. A projection direction 84 and a detection direction 85 of the two-dimensional slit light are respectively the directions shown by arrows in the drawing and are inclined with respect to the X direction 101 of the XY stage 16. In the illustrated case, the irradiation part of the two-dimensional slit light is at the boundary part of vertical patterns between the low-reflectance part 81 and the high-reflectance part 82 as shown in the drawing.

The two-dimensional image 83 is formed on the two-dimensional area sensor 71 shown in FIG. 4B by the detection lens 67 and the magnifying lens 70. When the magnification of the detection optical system is defined as m and the width, height, Xs direction pitch, and Ys direction pitch of each slit of the two-dimensional slit image 83 are defined as w, l, px, and py, respectively, the width, height, Xs direction pitch, and Ys direction pitch of the two-dimensional slit image on the two-dimensional area sensor 71 are mw·cos θ, ml, mpx·cos θ, and mpy, respectively. When the height of the measurement object 15 is varied by Δz, the two-dimensional slit image on the two-dimensional area sensor 71 is shifted by 2mΔz·sin θ in the Xs direction but is not shifted in the Ys direction. Therefore, the shift distance of the two-dimensional slit image in the Xs direction is calculated from the electrical signal of the two-dimensional slit image obtained by the two-dimensional area sensor 71, and the height Δz of the measurement object 15 can be detected from the shift distance in the Xs direction.

In order to calculate the shift distance of the two-dimensional slit image in the Xs direction, the shift distance in the Xs direction is calculated as a one-dimensional slit image in each row 112, 113, 114, 115, and 116 on the two-dimensional sensor 71. For this purpose, in the two-dimensional slit image on the two-dimensional area sensor 71, the detected light intensity in the Ys direction is added in the rows 112 to 116, and one-dimensional slit detected wavelengths 121 and 122 are respectively obtained in rows 86 and 87 as shown in FIG. 4C. At this time, when the slits are at the boundary part of the low-reflectance part 81 and the high-reflectance part 82 like slits 88, 89, 90, and 91 as shown in FIG. 4A, the wavelength of the corresponding slit part is distorted in the detected wavelengths 121 and 122. When the shift distance of the slit image is calculated from these wavelengths, detection errors 123 and 124 occur at the corresponding slit parts.

Therefore, in this embodiment, in the one-dimensional slit detected waveforms 121 and 122, symmetric property of the waveform is determined for each slit, the slit part where the waveform thereof is asymmetric is eliminated, and the height of the measurement object 15 is calculated from the shift distance of the slit image of the slit part other than the eliminated one. Therefore, as shown in FIG. 4D, the waveform of the slit part is clipped from the one-dimensional slit detected waveforms 121 and 122, and the height of the measurement object 15 whose detection errors are reduced can be obtained by performing a waveform symmetric property calculation process 131, an asymmetric waveform elimination process 132, and a height calculation process 133 shown in FIG. 4E.

Next, a process of clipping the waveform of each slit part from the one-dimensional detected waveform obtained in each of the rows 86 and 87 will be described with reference to FIG. 4D. The approximate value po of a pitch 125 of the one-dimensional detected waveform is po=m·mi·psx, when the pitch of the two-dimensional slit 64 in the Xs direction is defined as psx, the magnification of the projection optical system is defined as mi, and the magnification of the detection optical system is defined as m. Therefore, a maximum value is found from the one-dimensional detected waveform in each row, and a detected waveform corresponding to each slit is obtained by sequentially dividing the waveform by a pitch po from the position at which the maximum value is obtained. Then, regarding the waveform corresponding to each slit, a section obtained by a certain threshold value It 128 with respect to a larger value In 126 of the left and right valleys and a maximum value 127 is set as a detected waveform 129 of the slit part. The detected waveform 129 of each slit thus obtained is symmetrical when there is no difference in the reflectance on the measurement object 15. However, the detected waveforms are distorted and asymmetrical when the slits are at the boundary part of the low-reflectance part 81 and the high-reflectance part 82 like the slits 88, 89, 90, and 91.

Next, a detection method of the slit part where the waveform thereof is asymmetrical in the above-described manner in the waveform symmetric property calculation process 131 will be described with reference to FIGS. 5A to 5D.

Figure 5A:
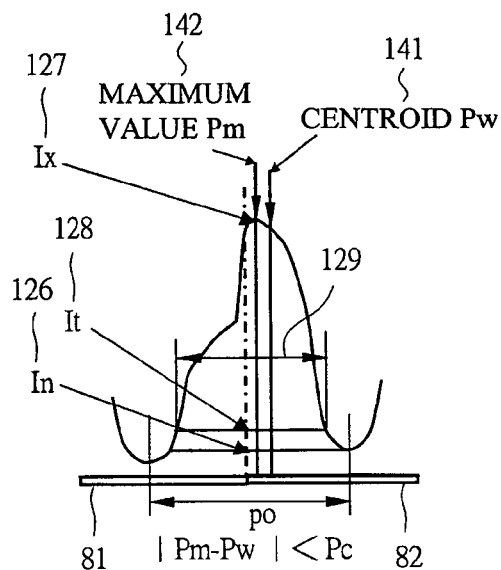
FIG. 5A is a detected waveform diagram showing an example of the case where the difference (misaligned amount) between the position of the centroid (Pw) and the position representing the maximum value (Pm) of a detected waveform is less than a permissible value Pc.
Figure 5B:
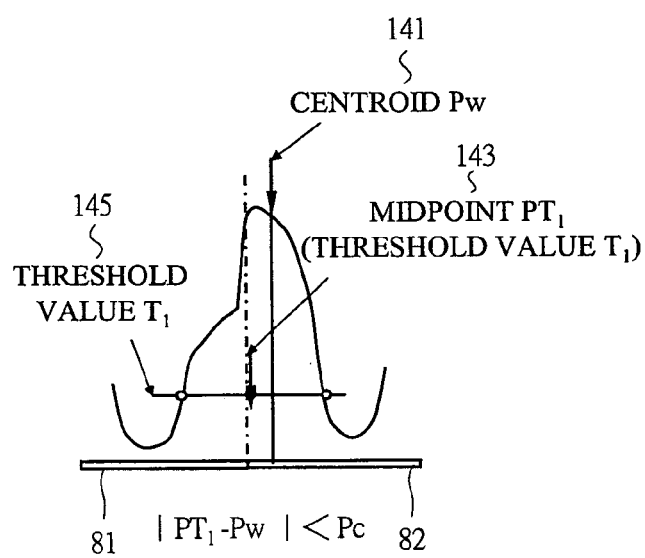
FIG. 5B is a detected waveform diagram showing an example of the case where the difference (misaligned amount) between the position of the centroid (Pw) and the position of the low threshold value midpoint ($Pt_l$) of a detected waveform is less than the permissible value Pc.
Figure 5C:
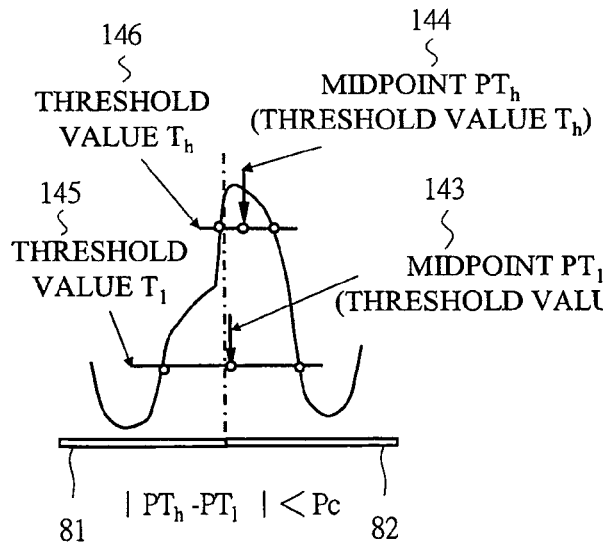
FIG. 5C is a detected waveform diagram showing an example of the case where the difference (misaligned amount) between the position of the high threshold value midpoint ($PT_h$) and the low threshold value midpoint ($PT_l$) of a detected waveform is less than the permissible value Pc.
Figure 5D:
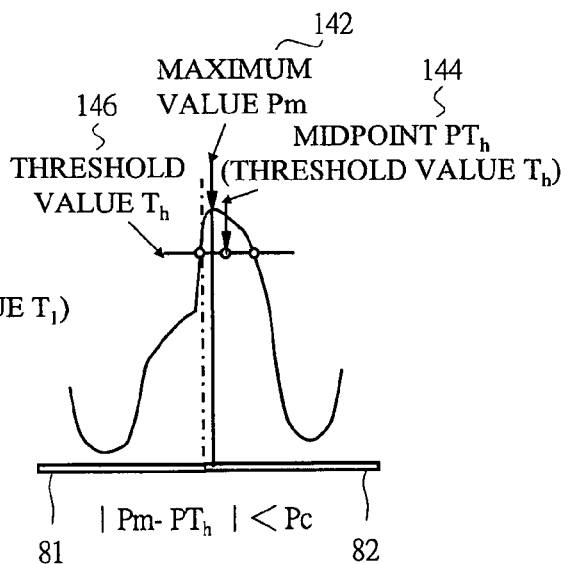
FIG. 5D is a detected waveform diagram showing an example of the case where the difference (misaligned amount) between the position representing the maximum value (Pm) and the position of the high threshold value midpoint ($PT_h$) of a detected waveform is less than the permissible value Pc.

In the waveform symmetric property calculation process 131, any two values of centroid Pw 141, a maximum value Pm 142, a low threshold value midpoint $PT_1$ 143, and a high threshold value midpoint $PT_h$ 144 are calculated for each slit from the detected waveform 129 of each slit part. When the two values coincide with each other with a certain permissible value Pc, the detected waveform is determined to be symmetrical and determined to be asymmetric when they do not coincide with each other. FIG. 5A is a detected waveform diagram showing an example of the case where the difference (misaligned amount) between the position of the centroid (Pw) and the position representing the maximum value (Pm) of a detected waveform is less than the permissible value Pc, FIG. 5B is a detected waveform diagram showing an example of the case where the difference (misaligned amount) between the position of the centroid (Pw) and the position of the low threshold value midpoint ($Pt_1$) of a detected waveform is less than a permissible value Pc, FIG. 5C is a detected waveform diagram showing an example of the case where the difference (misaligned amount) between the position of the high threshold value midpoint ($PT_h$) and the low threshold value midpoint ($PT_1$) of a detected waveform is less than the permissible value Pc, and FIG. 5D is a detected waveform diagram showing an example of the case where the difference (misaligned amount) between the position representing the maximum value (Pm) and the position of the high threshold value midpoint ($PT_h$) of a detected waveform is less than the permissible value Pc.

If the number of pixels of the two-dimensional area sensor 71 dominated by the detected waveform 129 of each slit part is comparatively large at the time of calculation, the centroid Pw 141 can be calculated at an accuracy equal to or less than the pixel size of the two-dimensional area sensor 71. However, when the maximum value Pm 142 is directly obtained from the detected waveform 129 of each slit part, only the accuracy of about the pixel size of the two-dimensional area sensor 71 which is a bad accuracy can be obtained. Therefore, the maximum value is calculated by performing interpolation. Also, points on both left and right sides where a small threshold value $T_1$ 145 or a large threshold value $T_h$ 146 intersects with the detected waveform 129 of each slit part are calculated, and the low threshold value midpoint $PT_1$ 143 or the high threshold value midpoint $PT_h$ 144 is calculated from the midpoint thereof.

In the asymmetrical waveform elimination process 132, the slit part having an asymmetric waveform is eliminated based on the result calculated in the waveform symmetric property calculation process 131, and the slit part having a symmetric waveform is selected. Subsequently, in the height calculation process 133, the centroid Pw 141, the maximum value Pm 142, the low threshold value midpoint $PT_1$ 143, and the high threshold value midpoint $PT_h$ 144 which are used in the waveform symmetric property calculation process 131 are equal with the permissible error Pc. Therefore, the position of the slit image of each slit is determined by using any one of them. Then, the shift distance of the slit image of each slit from the position of the slit image at z=0 is calculated. Since the shift distance is $2m\Delta z \cdot \sin\theta$, the height $\Delta z$ on the measurement object 15 of each slit is calculated. At this point, when the heights of the slits are averaged, an average height of the measurement points is obtained, and when the heights of the slits are associated with the two-dimensional positions of the slits, a height distribution of the measurement points is obtained.

Figure 6:
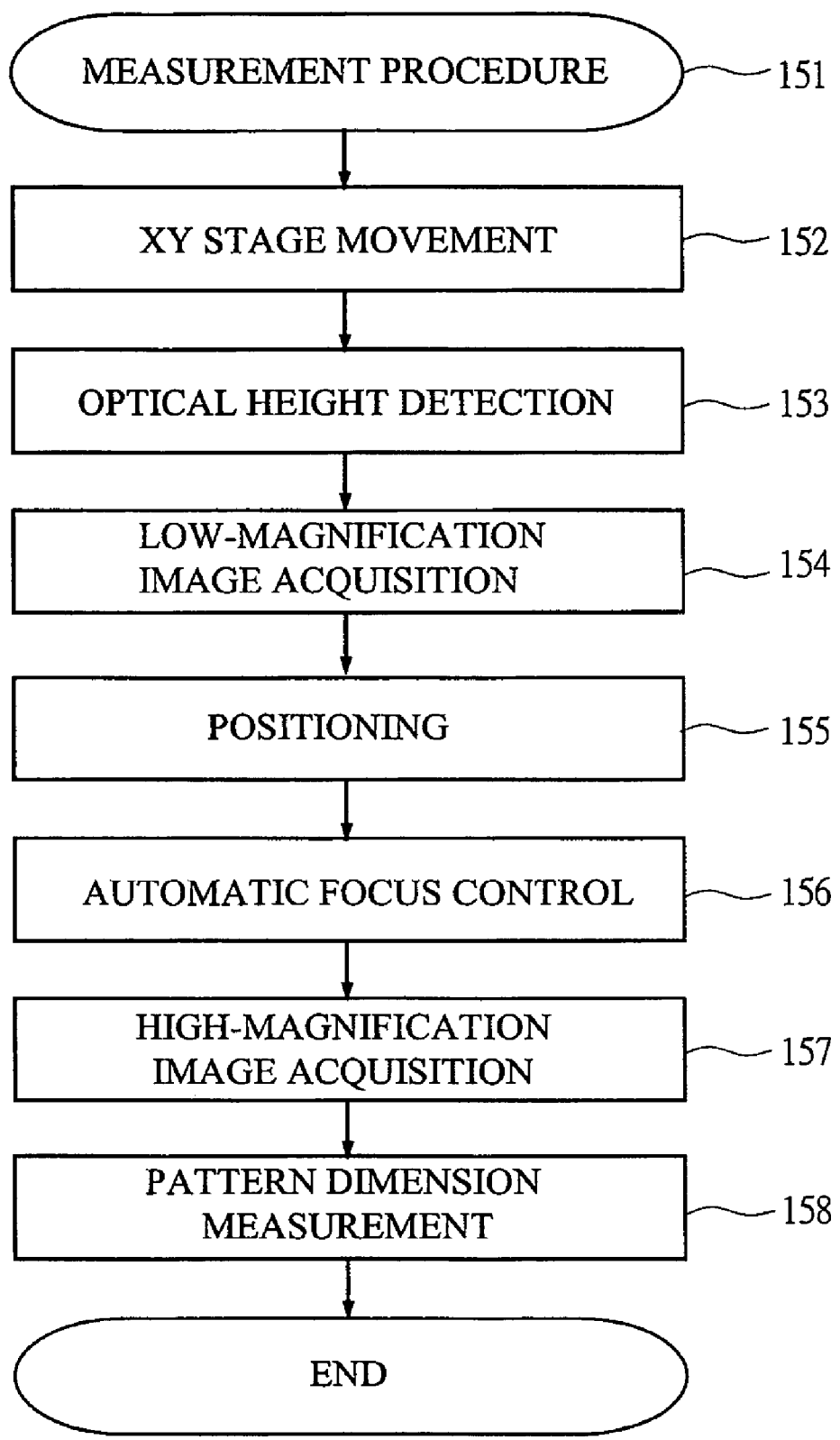
FIG. 6 is a flow chart showing a measurement procedure for measuring the measurement object.

Next, a method of measuring line widths of fine patterns and hole diameters of contact holes on the measurement object 15, that is, a semiconductor wafer by a CD-SEM apparatus will be described with reference to FIG. 1 and FIG. 6. FIG. 6 shows a measurement procedure 151 for measuring the measurement object 15 by the CD-SEM apparatus.

In the step of XY stage movement 152, the XY stage 16 on which the measurement object 15 is placed is driven by an instruction of the overall control system 41, and the XY stage 16 is positioned at a measurement position with high precision by the laser measurement device 17. After the positioning to the measurement point, in the step of optical height detection 153, two-dimensional slit light is projected to the measurement object 15 by the optical height detection optical system 31 according to an instruction of the overall control unit 41, the two-dimensional slit light reflected by the measurement object 15 is detected, and electrical signals of the two-dimensional slit image are detected by the two-dimensional area sensor. Then, the slit parts having large detection errors are eliminated from the detected electrical signals of the two-dimensional slit image and the height of the measurement object 15 is calculated by the height calculation processing device 32. In order to focus the scanning electron microscope on the calculated height, the excitation current of the objective lens 14 of the scanning electron microscope is adjusted by the focus controlling device 21.

Then, in the step of low-magnification image acquisition 154, a low-magnification electron image (SEM image) of the measurement object 15 is obtained by the scanning electron microscope. The scanning electron microscope converges an electron beam emitted from the electron beam source 11 by the condenser lens 12, causes the beam to perform two-dimensional scanning by the deflector 13, and then converges the beam by the objective lens 14 to irradiate the measurement object 15 with the beam. In order to maintain resolution power with a low acceleration voltage, the electron beam source 11 uses a field emission electron source or a Schottky electron source whose emitted electrons have a small energy width. Also, in order to obtain the electron beam of a low acceleration voltage, a retarding method in which a deceleration voltage is applied to the measurement object 15 is employed. The secondary electrons emitted from the measurement object 15 through irradiation of the electron beam are detected by the secondary electron detector 18, the secondary electron signal thereof is subjected to A/D conversion by the A/D converter 19, and a SEM image of the measurement object 15 is obtained by synchronizing the A/D converted secondary electron signal with a deflection signal of the deflector 13. The magnification of the SEM image is set by changing the scanning range of the deflector 13.

Then, in the step of positioning 155, according to the obtained low-magnification SEM image, addressing to a measurement point is performed through the matching with a pattern registered in advance. Then, in the step of automatic focus control 156, based on the height obtained in the optical height detection, the focal position of the objective lens 14 is varied by the automatic focus controlling device 22, a high-magnification SEM image is obtained at each of the varied positions, and the SEM images are evaluated to detect a focused focal point. In order to focus the focal position of the objective lens 14 on the obtained focused focal point, the excitation current of the objective lens 14 of the scanning electron microscope is adjusted by the focus controlling device 21. Then, in the step of high-magnification image acquisition 157, a high-magnification SEM image of the measurement object 15 is obtained by the scanning electron microscope. In the step of pattern dimension measurement 158, the image processing by the image processing means 20 is performed to the obtained high-magnification SEM image data, and widths of patterns, hole diameters of contact holes, and others in the specified image are measured.

As described above, in the CD-SEM apparatus, focusing of the objective lens 14 is performed at the time of acquiring the low-magnification and high-magnification SEM images. When acquiring the low-magnification image, the focused focal point value is a detected value in the optical height detection, and when acquiring the high-magnification image, the focused focal point is a focal point value obtained in automatic focusing which is performed based on the optical height detection. When highly accurate optical height detection is performed according to this embodiment, a focused high-quality SEM image can be obtained when acquiring the low-magnification image, and positioning according to the image can be performed with high accuracy. In addition, when acquiring the high-magnification image, the processing time of automatic focus control which is performed based on the optical height detection can be shortened. Therefore, the throughput of the CD-SEM apparatus can be improved.

Second Embodiment

Next, a CD-SEM apparatus in a second embodiment of the present invention will be described with reference to FIGS. 7A to 7C. In this embodiment, the height calculation processing device 32 which calculates the height of an object from a two-dimensional slit image is different from that in the first embodiment in that the slits eliminated as detection errors are the slits having large shift distances with respect to the shift distances of adjacent slits. Other parts of this embodiment are the same as those of the first embodiment.

In this embodiment, the shift distance of a slit image is calculated for each slit with respect to the detected waveform 129 of each slit part which is the clipped slit part shown in FIG. 4D, the differences between the calculated shift distance and the shift distances of adjacent slits are calculated, the slit part having a calculated difference from the adjacent shift distance larger than a predetermined value is eliminated, and the height of the object is detected by using the shift distances of the slit part having a calculated difference from the adjacent shift distance smaller than the predetermined value.

As an example of the measurement object 15 which is a target of this embodiment, the case as shown in FIG. 7A where a boundary part of patterns between a low-reflectance part 161 and a high-reflectance part 162 is present and a small step 163 is provided therein will be described.

A one-dimensional slit detected waveform 164 for the measurement object 15 is obtained through the method similar to that of FIG. 4C. In a slit part clipping process 171 shown in FIG. 7B, each slit part is clipped from the one-dimensional slit detected waveform 164 through the method similar to that of FIG. 4D, thereby obtaining the detected waveform of each slit part. Then, in a shift distance calculation process 172, the position of the slit image of each slit is determined according to a centroid or a low-threshold value midpoint from the detected waveform of the slit part. The shift distance of the slit image is calculated from the determined position of the slit image and the position of the slit image of the slit when z=0.

The measurement object 15 in this embodiment is positioned in the minus (−) direction of z as a whole, and there is the step 163. Therefore, the shift distance (+ is the upward direction) calculated in the shift distance calculation process 172 is larger in the high-reflectance part 162 as shown in FIG. 7C. Meanwhile, at the pattern boundary part, due to the reflectance difference between the patterns, the detected waveform is distorted, and the shift distance becomes the maximum. Therefore, when the height of the measurement object is calculated from this shift distance, a detection error occurs at the pattern boundary part.

Accordingly, in this embodiment, in an adjacent slit difference calculation process 173, shift distance differences 182 which are the differences with respect to the shift distances of adjacent slits 181 are calculated for each slit. Then, in a large-shift slit elimination process 174, if the shift distance differences 182 are larger than a predetermined value, it is eliminated from candidates of height detection as an abnormal slit 183. Then, in a height calculation process 175, since the shift distance is $2m\Delta z \cdot \sin \theta$, the height $\Delta z$ of each slit on the measurement object 15 is calculated.

When the slit width of the two-dimensional slit 64 is reduced, distortion in the detected waveform due to the reflectance difference at the pattern boundary is reduced. Therefore, the distortion at the pattern boundary cannot be detected in the method of the first embodiment in some cases. In this embodiment, attention is focused on the shift distances, and the part where a detection error is large is eliminated through comparison with adjacent slits. Accordingly, the slit of the part having a detection error can be eliminated and the height can be detected regardless of the slit width. According to this embodiment, since the accuracy of optical height detection can be increased, when measurement is performed by a CD-SEM apparatus in the manner similar to the above-described first embodiment, a high-quality electron beam image with a focused focal point can be obtained at the time of acquiring the low-magnification image, and highly accurate positioning according to the image can be performed. Moreover, at the time of acquiring the high-magnification image, the processing time of the automatic focus control which is performed based on the optical height detection can be shortened, and therefore, the throughput of the CD-SEM apparatus can be improved.

Third Embodiment

Next, a CD-SEM apparatus in a third embodiment of the present invention will be described with reference to FIGS. 8A to 8C. In this embodiment, the height calculation processing device 32 which calculates the height of an object from a two-dimensional slit image is different from those of the first embodiment and the second embodiment in that the shift distances of slits are applied to a curved line, and the slit eliminated as a detection error is a slit having a large difference from the curved line.

In this embodiment, in the slit part clipping process 171 shown in FIG. 7B of the above-described second embodiment, the shift distance of a slit image is calculated for each slit with respect to the detection waveform of each slit part which is a clipped slit part, the calculated shift distance is applied to a curved line respectively in the x direction and y direction for each detection line, the slit part having the large difference from the applied curved line is eliminated, and the height of the object is detected by using only the slit parts having small differences.

As an example of the measurement object 15 which is a target of this embodiment, the case where a boundary part of patterns between a low-reflectance part 191 and a high-reflectance part 192 is present and the object is inclined as a whole as shown in FIG. 8A will be described.

A one-dimensional slit detected waveform 193 for the measurement object 15 is obtained through the method similar to that of FIG. 4C. In a slit part clipping process 201 shown in FIG. 8B, each slit part is clipped from the one-dimensional slit detected waveform 193 through the method similar to that of FIG. 4D, thereby obtaining the detected waveform of each slit part. Then, in a shift distance calculation process 202, the position of the slit image of each slit is determined according to a centroid or a low-threshold value midpoint from the detected waveform of the slit part. The shift distance of the slit image is calculated from the determined position of the slit image and the position of the slit image of the slit when z=0.

The measurement object 15 in this embodiment is positioned in the plus (+) direction of z and inclined as a whole. Therefore, the shift distance (− is the upward direction) calculated in the shift distance calculation process 202 is larger in the high-reflectance part 192 as shown in FIG. 8C. Meanwhile, at the pattern boundary part, due to the reflectance difference between the patterns, the detected waveform is distorted, and the shift distance becomes the maximum. Therefore, when the height of the measurement object 15 is calculated from this shift distance, a detection error occurs at the pattern boundary part.

Therefore, in this embodiment, in a curved line application process 203, the calculated shift distance is applied to a curved line for each detection line respectively in the x direction and the y direction. In the application of the curved line, for example, the curved line can be represented by a cubic function, and a coefficient of the curved line is obtained by the least-square method. The obtained curved line represents the inclination of the measurement object 15. Then, in a large-shift slit elimination process 204, if the shift distance of a slit is larger than a predetermined value with respect to the applied curved line 211, it is eliminated from the candidates of height detection as an abnormal slit 212. Processes in the two directions of x and y are performed in an xy direction termination process 205, and in a height calculation process 206, the height Δz of each slit on the measurement object 15 is calculated since the shift distance is 2mΔz·sin θ.

In this embodiment, even when the inclination of the measurement object is large, the inclined part is not eliminated as a part including a detection error. Therefore, it can be adapted to various measurement objects. According to this embodiment, the accuracy of the optical height detection is increased. Therefore, when measurement is to be performed by the CD-SEM apparatus in the same manner as the second embodiment, a high-quality electron beam image of a focused focal position can be obtained, and positioning by the image can be performed with high accuracy. Further, since the processing time of the automatic focus control which is performed based on the optical height detection can be reduced, the throughput of the CD-SEM apparatus can be improved.

Application Examples of First to Third Embodiments

Figure 9A:
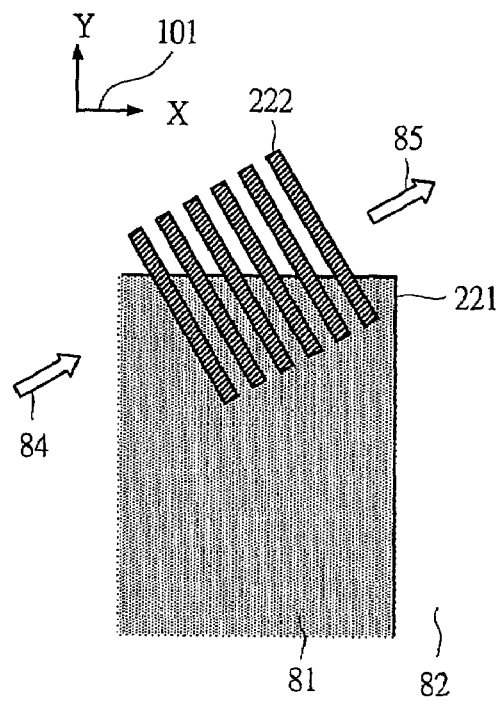
FIG. 9A is a plan view of a measurement object showing the state where a multi-slit image is projected.
Figure 9B:
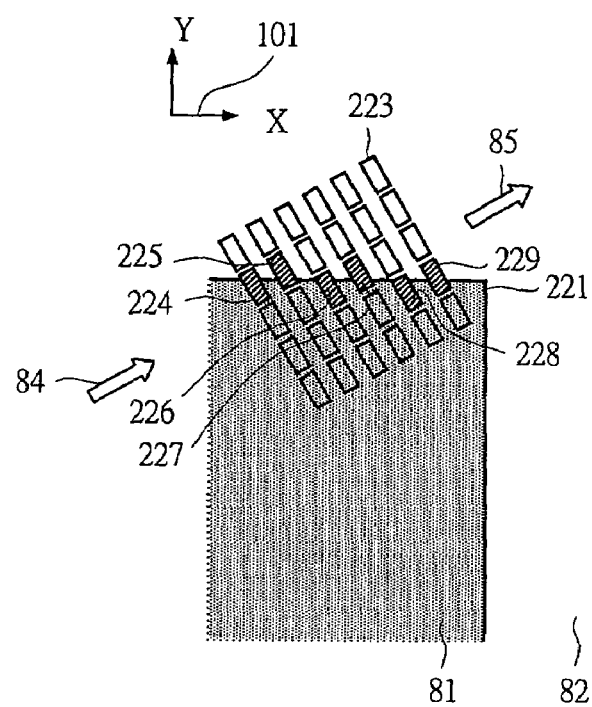
FIG. 9B is a plan view of a measurement object showing the state where a two-dimensional slit image is projected.

The above-described first embodiment, second embodiment, and third embodiment have been described by employing the case where the irradiation part of the two-dimensional slit light projected onto the measurement object 15 is at the boundary part of vertical patterns composed of the low-reflectance part 81 and the high-reflectance part 82 as shown in FIG. 4A. However, as shown in FIGS. 9A and 9B, the case where the irradiation part is at a boundary part 221 of horizontal patterns composed of the low-reflectance part 81 and the high-reflectance part 82 is also possible. The projection direction 84 and the detection direction 85 of the two-dimensional slit light are respectively in the directions represented by arrows in the drawings and are inclined with respect to the X direction 101 of the XY stage 16.

As shown in FIG. 9A, in the case of multi-slits, the influence of the reflectance difference between the patterns appears in all the slits in a multi-slit image 222. Therefore, even when a process of averaging or weighting the detection positions of the slits is performed, detection errors cannot be reduced. On the other hand, in the case of two-dimensional slits as shown in FIG. 9B, the influence of the reflectance difference between the patterns appears only in a part of the slits, that is, slits 224 to 229 in a two-dimensional slit image 223. Therefore, when the slits at the pattern boundary part where detection errors are large are detected and the detected slit parts are eliminated through the methods described in the first to the third embodiments, height detection with reduced detection errors can be performed.

In general, the boundary of patterns extends in a vertical or horizontal direction in many cases. However, there is also a case where the direction of the boundary of patterns is vertical to the projection direction 84 and the detection direction 85 of two-dimensional slit light. In such a case, the boundary part of the patterns in a two-dimensional slit image corresponds to one column of the slits in the vertical direction. Also in this case, detection with reduced detection errors can be performed by eliminating the slit parts at the boundary part of the patterns where the detection errors are large through the methods described in the first to third embodiment. As described above, in this embodiment, regardless of the direction of the boundary of patterns, highly-accurate optical height detection with reduced detection errors can be performed.

Figure 10:
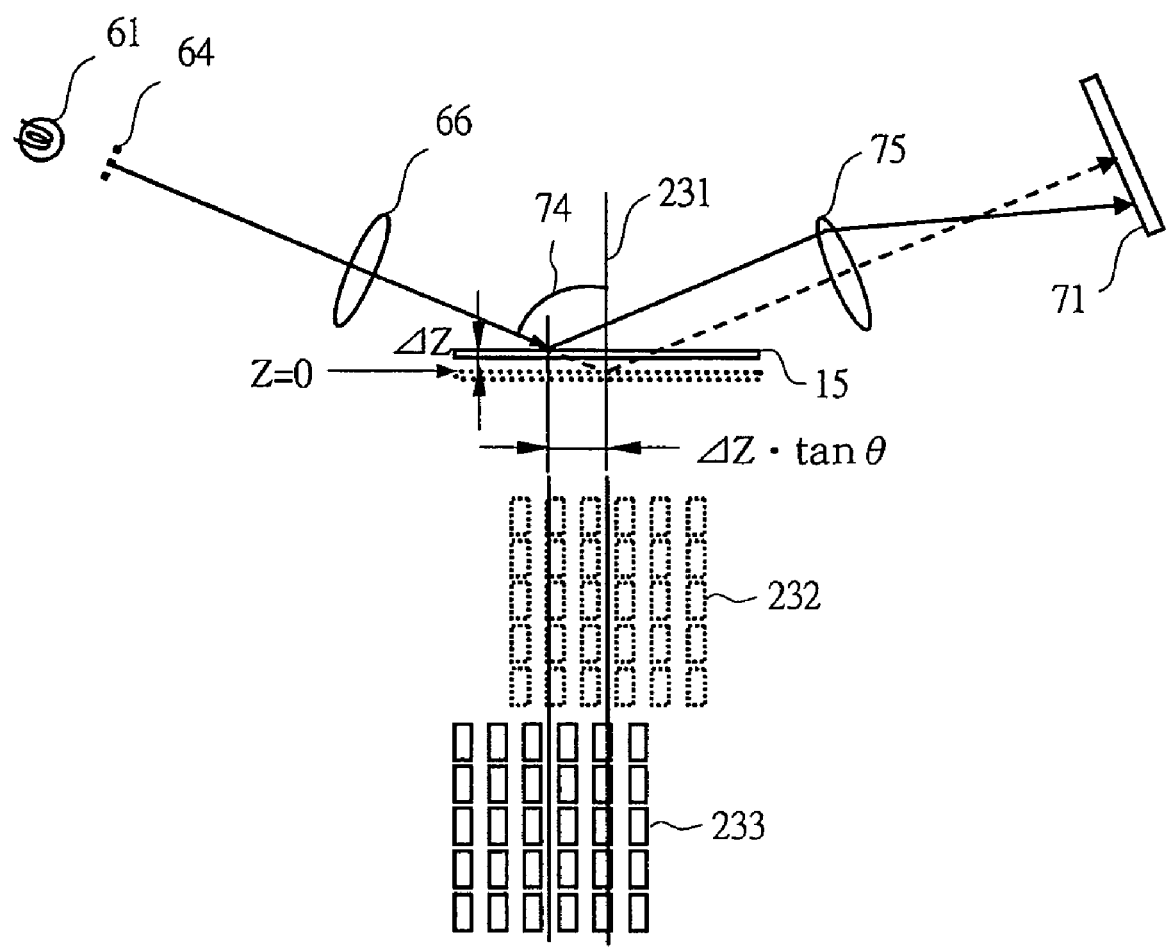
FIG. 10 is a schematic diagram for explaining a method for calculating a slit position from a detected height.

Furthermore, as shown in FIG. 10, with respect to the height distribution corresponding to two-dimensional positions of slits obtained through the methods of the first to third embodiments, the two-dimensional positions of the slits can be calculated from the obtained heights with high accuracy. As shown in FIG. 10, the center of a two-dimensional slit image 232 when the height of the measurement object 15 is z=0 matches an optical axis 231 of the electron optical system of the CD-SEM apparatus. However, when the height of the measurement object 15 is varied by Δz, the center of a two-dimensional slit image 233 is shifted by Δz·tan θ from the optical axis 231 of the electron optical system of the CD-SEM apparatus (although it is shifted also in the vertical direction in the drawing for convenience, it is shifted only in the horizontal direction). Therefore, when the height obtained for each slit is used to similarly shift the position of each of the slits by Δz·tan θ, appropriately corrected slit positions can be obtained. By use of the corrected slit positions, for example, the height on the optical axis 231 of the electron optical system can be obtained. The height distribution according to the two-dimensional positions of the slits can be utilized, for example, when the height at a shift position at the time of image shift in the CD-SEM apparatus is to be obtained.

Fourth Embodiment

Figure 11:
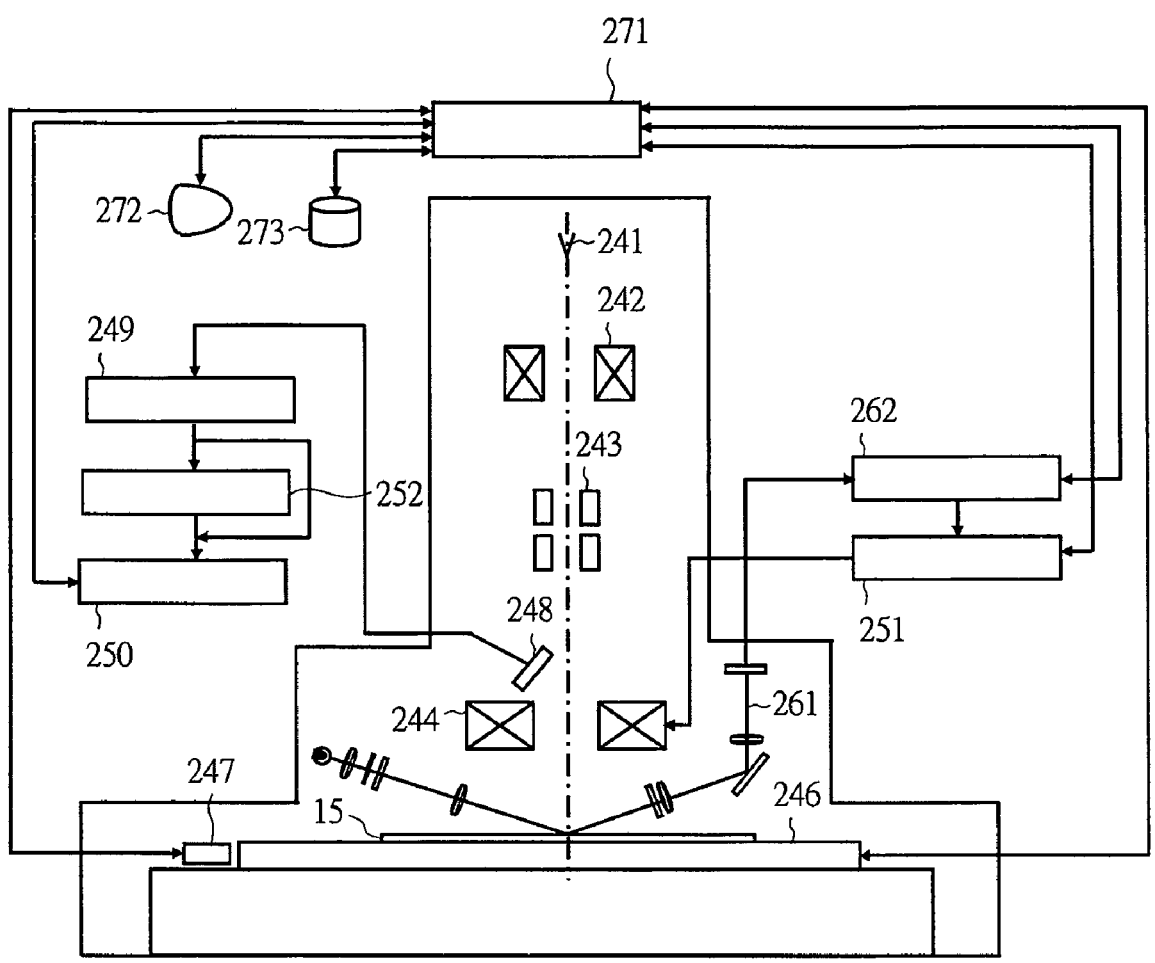
FIG. 11 is a schematic diagram showing a configuration of the SEM inspection apparatus in the fourth embodiment of the present invention.

A SEM inspection apparatus in a fourth embodiment of the present invention will be described with reference to FIG. 11. FIG. 11 is a diagram showing a configuration of the SEM inspection apparatus. The SEM inspection apparatus is an appearance inspection apparatus which detects defects of fine patterns on a semiconductor wafer by use of an electron beam having high resolution power instead of an optical appearance inspection apparatus which has been conventionally used. The SEM inspection apparatus obtains an electron beam image (SEM image) of fine patterns formed on the measurement object 15 by a scanning electron microscope and detects defects of the measurement object 15 through pattern comparison of the SEM image.

The SEM inspection apparatus comprises: a scanning electron microscope system which obtains a SEM image of the measurement target apparatus 15 and performs image processing such as pattern comparison; a focus control system which performs focusing of the scanning electron microscope; an optical height detection system which detects the height of the measurement object 15; and an overall control system.

The scanning electron microscope system includes: an electron beam source 241 which emits an electron beam; a condenser lens 242 which converges the electron beam emitted from the electron beam source 241; a deflector 243 which performs the scanning of the converged electron beam; an objective lens 244 which converges the electron beam onto the measurement object 15; an XY stage 246 on which the measurement object 15 is placed; a laser measurement device 247 which measures the position of the measurement object 15; a secondary electron detector 248 which detects secondary electrons emitted from the measurement object 15 through irradiation of the electron beam; an A/D converter 249 which performs A/D conversion of the detected secondary electron signals; an image memory 252 which stores SEM images of the A/D-converted secondary electron signals; and image processing means 250 which performs the image processing of the SEM images and detects defects through pattern comparison of the SEM images.

The focus control system includes: a focus controlling device 251 which performs focusing of the objective lens 244 by adjusting an excitation current of the objective lens 244 of the scanning electron microscope.

The optical height detection system includes: an optical height detection optical system 261 which projects two-dimensional slit light to the measurement object 15, detects the two-dimensional slit light reflected by the measurement object 15, and detects an electrical signal of a two-dimensional slit image thereof by a two-dimensional area sensor; and a height calculation processing device 262 which eliminates the slit part having a large detection error from the electrical signal of the two-dimensional slit image and calculates the height of the object. The optical height detection optical system 261 is the same as the optical height detection optical system 31 of the first embodiment.

The overall control system includes: an overall control unit 271 which performs the overall control of the scanning electron microscope system, the focus control system, and the optical height detection system, and also displays a processing result by the image processing means 250 on display means 272 and stores it in storage means 273.

Next, a method of detecting a defect of fine patterns on the measurement object 15, that is, a semiconductor wafer by a SEM inspection apparatus will be described with reference to FIG. 11. In a method for acquiring a SEM image, an electron beam is caused to perform two-dimensional scanning in the state where the XY stage 246 is not moved, and the SEM image is acquired in the step-and-repeat manner.

In the SEM inspection apparatus, in order to inspect a wide area at a high speed, the XY stage 246 is moved at a constant speed in one direction, and the electron beam is caused to scan the object in a direction perpendicular to the movement direction of the XY stage, thereby obtaining a two-dimensional SEM image. Then, the XY stage 246 on which the measurement object 15 is placed is driven at a constant speed in the X direction according to an instruction of the overall control unit 271. At the same time with this, the deflector 243 causes the electron beam to scan the object in the Y direction which is orthogonal to that according to an instruction of the overall control unit 271. The position of the XY stage 246 is monitored by the laser measurement device 247.

In addition, at the same time with this, two-dimensional slit light is projected onto the measurement object 15 by the optical height detection optical system 261 according to an instruction of the overall control unit 271, the two-dimensional slit light reflected by the measurement object 15 is detected, and an electrical signal of the two-dimensional slit image is detected by the two-dimensional area sensor. Then, the height calculation processing device 262 eliminates the slit part where a detection error is large from the detected electrical signal of the two-dimensional slit image and calculates the height of the measurement object 15. In order to focus the focal point of the scanning electron microscope to the calculated height, the excitation current of the objective lens 244 of the scanning electron microscope is adjusted by the focus controlling device 251.

The scanning electron microscope converges the electron beam emitted from the electron beam source 241 by the condenser lens 242, scans the beam in the Y direction by the deflector 243, converges the beam by the objective lens 244, and irradiates the measurement object 15 with the beam. The secondary electrons emitted from the measurement object 15 through the irradiation of the electron beam are detected by the secondary electron detector 248, A/D conversion of a secondary electron signal thereof is performed by the A/D converter 249, and a SEM image of the measurement object 15 is obtained from the A/D converted secondary electron signal. When acquiring the SEM image, the height of the measurement object 15 is detected by the optical height detection system while moving the XY stage 246, and focusing of the objective lens 244 is performed by using the height detected value by the focus controlling device 251. Therefore, a high-quality SEM image of a focused focal position can be obtained.

The electron beam source 241 performs scanning with a large-current electron beam at high speed instead of performing scanning with a low-current electron beam at low speed like a normal SEM apparatus. Therefore, a thermal field emission electron source is used. Also, in order to obtain high resolution power in a low acceleration voltage region of the electron beam, a retarding method in which a deceleration voltage is applied to the measurement object 15 is employed. In this case, since the secondary electrons emitted from the measurement object 15 are accelerated, a device which deflects and reflects the secondary electrons is required although it is not shown in the drawing.

Then, the image processing means 250 compares the SEM image by the image memory 252 which is delayed by a certain time with a SEM image which is directly inputted from the A/D converter 249 to detect an unmatched part as a defect. When the SEM image obtained in the image memory 252 is delayed by the time by which the XY stage 246 moves a distance corresponding to a pitch of a die, the comparison test is a die comparison, and when it is delayed by the time by which the stage moves a distance corresponding to a pitch of a memory cell, the comparison test is a cell comparison.

Next, the height calculation processing device 262 in the optical height detection system will be described. The method in which the shift distance of the two-dimensional slit image is calculated from the electrical signal of the two-dimensional slit image obtained by the two-dimensional area sensor 71 and the height $\Delta z$ corresponding to each of the two-dimensional slit positions of the measurement object 15 is calculated from the shift distance of each slit in the height calculation processing device 262 is the same as those in the first to third embodiments. However, the SEM inspection apparatus is different from the CD-SEM apparatus in that the SEM images are acquired while moving the stage. Therefore, time delay t is caused in the two-dimensional area sensor 71, the height calculation process, and the focus controlling device 251 even when the objective lens is focused by the focus controlling device 251 based on a height calculation result. Accordingly, when the feeding speed of the stage is v, the actual height of the measurement object 15 is the height at the position which is displaced by vt. Therefore, by installing the optical height detection system so as to measure the position corresponding to this position displaced distance vt in advance, height detection can be performed with high accuracy even when the stage is moving.

As described above, in the SEM inspection apparatus, height detection is performed while taking into consideration the position displaced distance of the slit to which height detection is to be performed. Therefore, even when SEM images are to be acquired while moving the stage, focusing of the objective lens 244 can be performed with high accuracy in real time. Thus, high-quality SEM images of focused focal positions can be obtained, and highly reliable inspection can be performed.

Application Examples of the First to Fourth Embodiments

Figure 12:
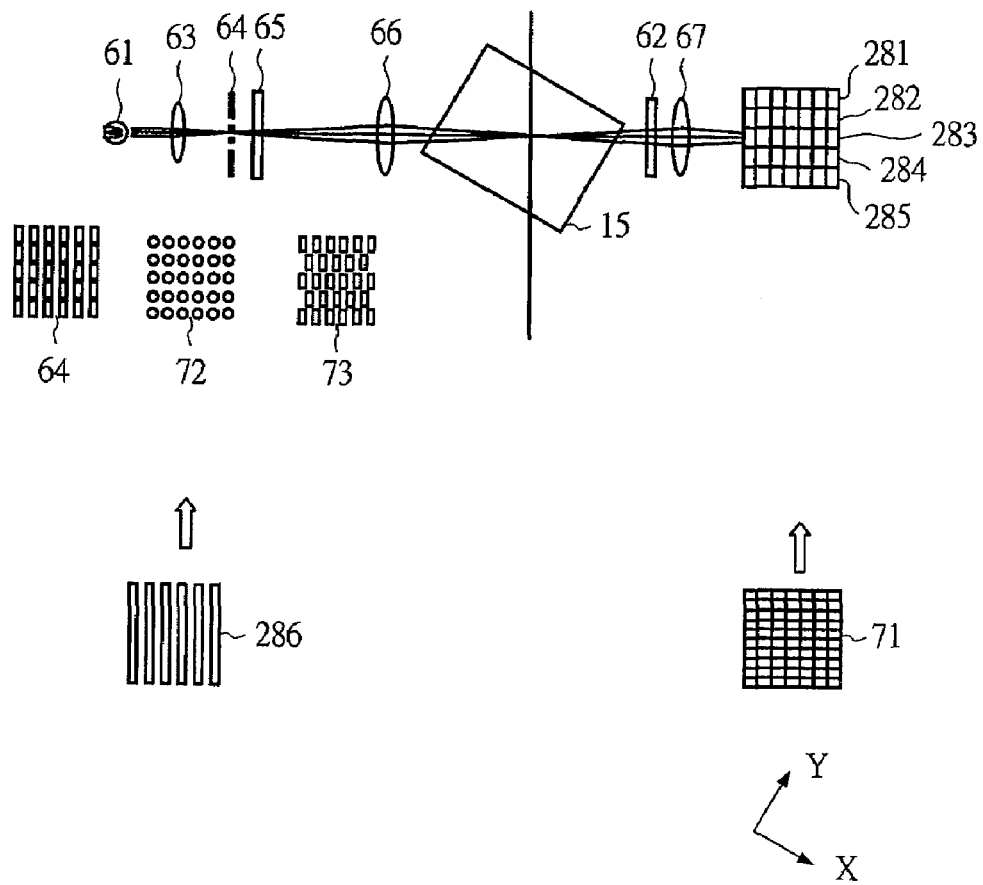
FIG. 12 is a schematic diagram showing a configuration of the case where one-dimensional line sensors and multi-slits are used in the optical height detection optical system in application examples of the first to fourth embodiments of the present invention.

Incidentally, in the first to fourth embodiments, in the optical height detection optical system 31 shown in FIGS. 2A and 2B, instead of the two-dimensional area sensor 71 which detects two-dimensional slit light, a plurality of one-dimensional line sensors 281, 282, 283, 284, and 285 may be aligned in a column as shown in FIG. 12. In this case, the number of the one-dimensional line sensors to be prepared has to be equivalent to the number of the rows of the slits of the two-dimensional slit 64, 72, or 73. Also, the method may be employed, in which multi-slits 286 shown in FIG. 12 are used instead of the two-dimensional slit 64 shown in FIG. 2A, the two-dimensional area sensor 71 is used as a sensor which detects multi-slit light, and the positions of the slits of the multi-slits 286 are detected from the pixel positions on the two-dimensional area sensor 71, thereby practically detecting the two-dimensional slit light.

Figure 13:
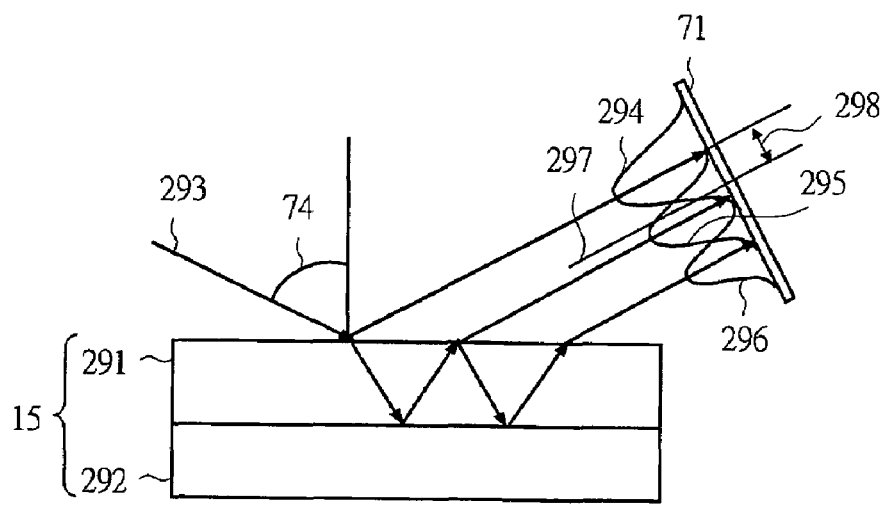
FIG. 13 is a schematic diagram for explaining detection errors caused by multi-reflection in application examples of the first to fourth embodiments of the present invention.
Figure 15A:
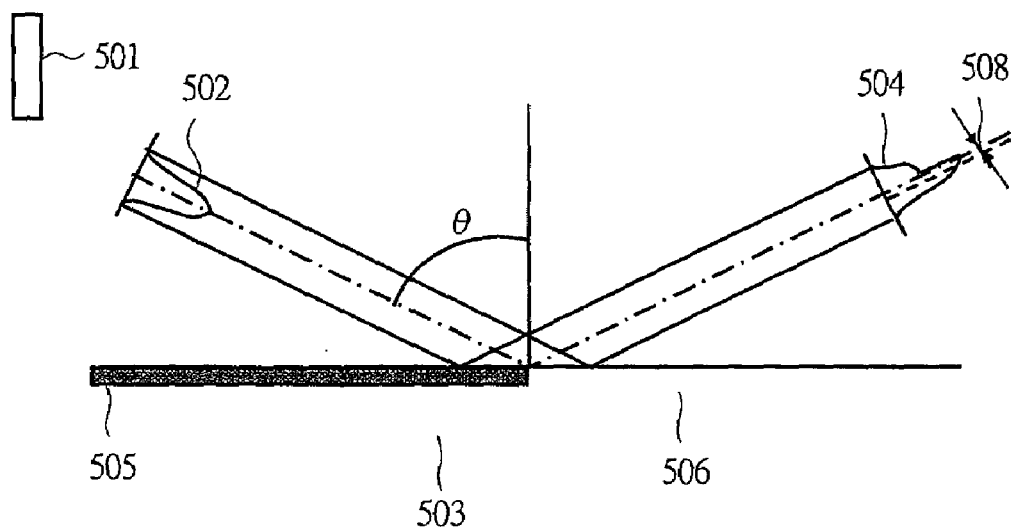
FIG. 15A is a diagram for explaining a single slit method of a conventional technology and is a cross sectional view of a measurement object showing the state where single slit light enters the measurement object and is reflected.
Figure 15B:
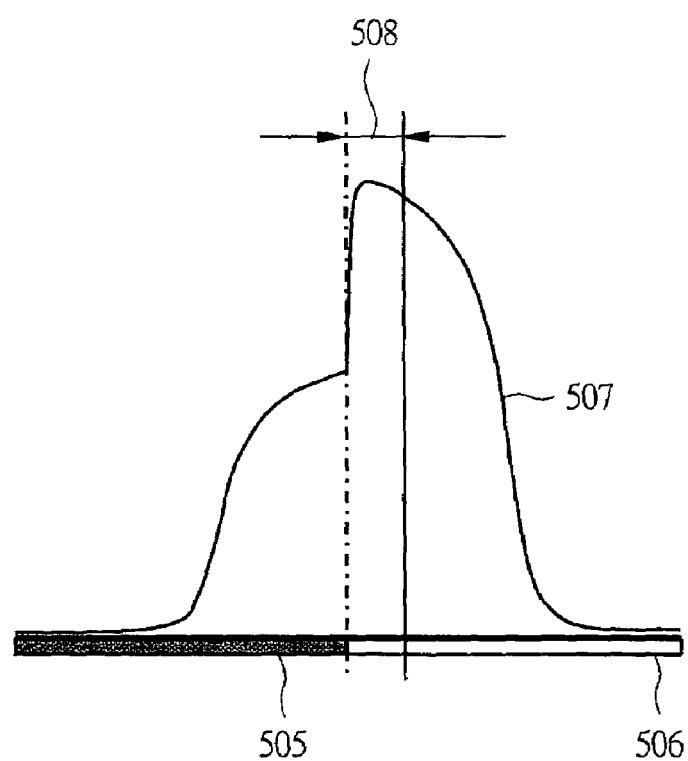
FIG. 15B is a diagram for explaining the single slit method of the conventional technology and is a diagram of a detected waveform signal obtained by detecting a reflected light image of the single slit light.

Next, an incident angle θ 74 of the two-dimensional slit light to the measurement object 15 shown in FIG. 2A in the first to the fourth embodiments will be described. The case where the measurement object 15 includes an $SiO_2$ film 291 which is a transparent thin film formed on the surface of an Si substrate 292 as shown in FIG. 13 will be described. One slit which is positioned as a slit at the center of the two-dimensional slit 64 will be described herein.

A part of slit light 293 is reflected by the $SiO_2$ film 291, and the rest thereof transmits through it. However, the transmitted slit light repeats multi-reflection, the slit light 293 forms a plurality of slit images 294, 295, and 296 on the two-dimensional area sensor 71, and a slit image position 297 is displaced as a whole. The larger the incident angle θ 74, the smaller the displaced distance 298 of the slit position. This is because, since the reflectance in the $SiO_2$ film 291 is increased as the incident angle θ 74 of the slit light 293 increases, the incident light intensity of the slit light 293 to the $SiO_2$ film 291 is reduced and the multi-reflection is not readily caused. Therefore, regarding the multi-reflection, the larger the incident angle θ 74, the smaller the displaced distance 298 of the slit position, and the smaller the detection error. Moreover, the influence due to a detection error caused by multi-reflection exerted on the slit width is small. Also, regarding polarized light, the displaced distance 298 is smaller when the slit light 293 is S-polarized light in comparison with the case when it is P-polarized light. This is because the reflectance of the $SiO_2$ film 291 is larger in the case of the S-polarized light in comparison with the case of P-polarized light.

Meanwhile, the case where two-dimensional slit light irradiates a boundary part 303 of vertical patterns of a low-reflectance part 301 and a high-reflectance part 302 of the measurement object 15 at the incident angle θ 74 as shown in FIG. 14A will be examined. In this case, one slit which is positioned as a slit at the center of the two-dimensional slit 64 will be described.

When a slit width 305 is d and the magnification of the projection optical system is 1, a slit image width 306 projected onto the measurement object 15 by slit light 304 is d/cos θ. Then, when the incident angle 74 is varied in a range of 50 to 80°, the larger the incident angle θ 74, the larger the slit image width 306 of the two-dimensional slit light which is projected onto the measurement object 15 as shown in FIG. 14B. Note that a projection direction 307 and a detection direction 308 of the slit light 304 are respectively in the directions represented by arrows in the drawing and are inclined with respect to the X direction 101 of the XY stage 16. Also, when the slit image width 306 is increased, as is clear from the drawing, the length where the boundary part 303 of the patterns crosses the slit is increased, the difference in the intensity distribution of detected light 309 from the slit between the low-reflectance side and the high-reflectance side is increased, and distortion in the intensity distribution of the detected light is increased. When the distortion in the intensity distribution is increased, the displaced distance of the image-formed position of the slit which is calculated based on that is increased. Therefore, at the boundary part, the larger the incident angle θ 74, the larger the detection error. Also, the slit image width 306 is proportional to d of the slit width 305 and is reduced as the slit width is reduced. Therefore, the smaller the slit width, the smaller the detection error at the pattern boundary part.

In view of the foregoing, when the influence of the multi-reflection and detection errors at the pattern boundary part are taken into consideration, the larger the slit width, the larger the influence of a detection error at a pattern boundary part, and the smaller the slit width, the larger the influence due to multi-reflection. Therefore, when the slit width is large, the detection error at the pattern boundary part becomes dominant, wherein the larger the incident angle θ 74, the larger the detection error. Meanwhile, when the slit width is small, the detection error due to multi-reflection becomes dominant, wherein the larger the incident angle θ 74, the smaller the detection error. Therefore, in order to reduce the detection error, the incident angle θ 74 is not always required to be increased. When the slit width is comparatively large, the detection error is reduced by reducing the incident angle θ 74 in some cases.

In this embodiment, since the height calculation processing device 32 eliminates the slit parts where detection errors are generated so as to calculate the height, the number of the slit parts to be eliminated can be minimized by appropriately selecting the incident angle θ 74.

In the foregoing, the invention made by the inventors of the present invention has been concretely described based on the embodiments. However, it is needless to say that the present invention is not limited to the foregoing embodiments and various modifications and alterations can be made within the scope of the present invention.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for optically detecting a height of a specimen surface, comprising steps of:
    using a two-dimensional slit to project a two-dimensional symmetrical light pattern to an object from a position diagonally above said object;
    forming an image of the projected two-dimensional symmetrical light pattern projected on said object;

detecting said image of the two-dimensional light pattern by a two-dimensional area sensor and converting said detected image into an electrical signal;

selecting electrical signal having a symmetrical wave pattern from the electrical signal converted from the detected image; and detecting a height of said object by using information obtained from the selected electrical signal.

2. The method for optically detecting the height of the specimen surface according to claim 1, wherein, the step of detecting a height of said object, results in a detection error that is large, from the electrical signal of the converted two-dimensional slit image, and wherein a symmetric property of a detected waveform is calculated for each slit, slit parts having an asymmetrical waveform are eliminated, and a height detection process of said object is performed by using only slit parts having a symmetric waveform.

3. The method for optically detecting the height of the specimen surface according to claim 1, wherein, the step of detecting a height of said object, results in a detection error that is large, from the electrical signal of the converted two-dimensional slit image, and wherein a shift distance of the slit image is calculated for each slit, a difference between the calculated shift distance and a shift distance of an adjacent slit is calculated, slit parts in which the difference between the calculated shift distance and the adjacent shift distance is larger than a predetermined value are eliminated, and a height detection process of said object is performed by using only the shift distance of slit parts in which the difference between the calculated shift distance and the adjacent shift distance is smaller than the predetermined value.

4. The method for optically detecting the height of the specimen surface according to claim 1, wherein, the step of detecting a height of said object, results in a detection error that is large, from the electrical signal of the converted two-dimensional slit image, and wherein a shift distance of the slit image is calculated for each slit, the calculated shift distance is applied to a curved line for each detection line respectively in an x direction and a y direction, slit parts in which the difference between the shift distance and the applied curved line is large are eliminated, and a height detection process of said object is performed by using only slit parts in which the difference is small.

5. The method for optically detecting the height of the specimen surface according to claim 1, wherein one-dimensional multi-slits are used as the slits of a projection optical system for projecting the two-dimensional slit light to said object, and the two-dimensional slit image is obtained from pixel positions of the two-dimensional area sensor which detects the slit lights by the multi-slits.

6. An apparatus using a charged particle beam, comprising:
a scanning electron microscope system including an electron beam source, a condenser lens which converges an electron beam emitted from said electron beam source, a deflector which deflects the electron beam converged by said condenser lens, an objective lens which converges said electron beam deflected by said deflector onto a measurement object to irradiate the object with the beam, a secondary electron detector which detects secondary electrons generated from said measurement object irradiated with said electron beam, and an image processing unit which measures a pattern formed on said measurement object based on a secondary electron beam image detected by said secondary electron detector;

a focus control system including a focus control unit which performs focus control by controlling an excitation current of said objective lens, and an automatic focus control unit which performs automatic focus control of said objective lens according to said secondary electron beam image; and a height detection optical system including a projection optical unit which projects two-dimensional symmetrical light pattern to said measurement object from a position diagonally above the object, an optical image forming unit which forms an image of the two-dimensional symmetrical light pattern projected on measurement object by the projection optical unit a two-dimensional area sensor which detects said optical image of the two-dimensional light pattern and converts two-dimensional optical image detected by said detection optical unit into an electrical signal, and a height detection unit which detects a height of said measurement object by using information obtained from a converted electrical signal having a symmetrical wave pattern selected from the electrical signal converted from the detected image.

7. The apparatus using the charged particle beam according to claim 6, wherein said height detection unit of said height detection optical system calculates symmetric property of the detected waveform for each slit from the electrical signal of the converted two-dimensional slit image, eliminates slit parts of an asymmetric waveform from data of the calculated symmetric property, and detects the height of said measurement object by using only slit parts of a symmetric waveform.

8. The apparatus using the charged particle beam according to claim 6, wherein said height detection unit of said height detection optical system calculates a shift distance of the slit image for each slit from the electrical signal of the converted two-dimensional slit image, calculates a difference between the calculated shift distance and a shift distance of an adjacent slit, eliminates slit parts in which the difference between the calculated shift distance and the shift distance of the adjacent slit is larger than a predetermined value, and detects the height of said measurement object by using the shift distance of slit parts in which the difference between the calculated shift distance and the adjacent shift distance is smaller than the predetermined value.

9. The apparatus using the charged particle beam according to claim 6, wherein said height detection unit of said height detection optical system calculates a shift distance of the slit image for each slit from the electrical signal of the converted two-dimensional slit image, applies the calculated shift distance to a curved line for each detection line respectively in an x direction and a y direction, eliminates slit parts in which the difference between the shift distance and the curved line applied for the detection line is large, and detects the height of said measurement object by using only slit parts in which the difference is small.

* * * * *